US011192250B1

(12) United States Patent
Hinterstoisser

(10) Patent No.: US 11,192,250 B1
(45) Date of Patent: Dec. 7, 2021

(54) METHODS AND APPARATUS FOR DETERMINING THE POSE OF AN OBJECT BASED ON POINT CLOUD DATA

(71) Applicant: X Development LLC, Mountain View, CA (US)

(72) Inventor: Stefan Hinterstoisser, Mountain View, CA (US)

(73) Assignee: X DEVELOPMENT LLC, Mountain View, CA (US)

( * ) Notice: Subject to any disclaimer, the term of this patent is extended or adjusted under 35 U.S.C. 154(b) by 108 days.

(21) Appl. No.: 16/665,273

(22) Filed: Oct. 28, 2019

Related U.S. Application Data

(63) Continuation of application No. 15/811,484, filed on Nov. 13, 2017, now Pat. No. 10,500,727, which is a continuation of application No. 15/046,870, filed on Feb. 18, 2016, now Pat. No. 9,868,212.

(51) Int. Cl.
*B25J 9/16* (2006.01)
*G06F 30/00* (2020.01)

(52) U.S. Cl.
CPC ............ *B25J 9/1671* (2013.01); *G06F 30/00* (2020.01)

(58) Field of Classification Search
CPC ................................ B25J 9/1671; G06F 30/00
See application file for complete search history.

(56) References Cited

U.S. PATENT DOCUMENTS

| | | | | |
|---|---|---|---|---|
| 5,666,441 A | * | 9/1997 | Rao | G06K 9/4638 382/199 |
| 5,864,779 A | * | 1/1999 | Fujimoto | G06K 9/4633 702/179 |
| 5,872,870 A | * | 2/1999 | Michael | G06T 7/70 382/291 |
| 6,173,066 B1 | * | 1/2001 | Peurach | G06K 9/6211 382/103 |
| 6,246,468 B1 | * | 6/2001 | Dimsdale | G01B 11/002 356/4.02 |

(Continued)

FOREIGN PATENT DOCUMENTS

| | | | |
|---|---|---|---|
| EP | 3314570 B1 | * | 4/2020 |
| WO | WO 2015/002114 A1 | * | 1/2015 |

OTHER PUBLICATIONS

"3D Object Recognition and Pose Estimation From Point Cloud Using Stably Observed Point Pair Feature;" Deping Li, Hanyun Wang, Ning Liu, Xiaoming Wang, Jin Xu; IEEE Access (vol. 8, pp. 44335-44345); Jan. 1, 2020.*

(Continued)

*Primary Examiner* — Khoi H Tran
*Assistant Examiner* — Jorge O Peche
(74) *Attorney, Agent, or Firm* — Middleton Reutlinger

(57) ABSTRACT

Methods, apparatus, and computer readable media that are related to 3D object detection and pose determination and that may optionally increase the robustness and/or efficiency of the 3D object recognition and pose determination. Some implementations are generally directed to techniques for generating an object model of an object based on model point cloud data of the object. Some implementations of the present disclosure are additionally and/or alternatively directed to techniques for application of acquired 3D scene point cloud data to a stored object model of an object to detect the object and/or determine the pose of the object.

18 Claims, 11 Drawing Sheets

(56) References Cited

U.S. PATENT DOCUMENTS

| | | | |
|---|---|---|---|
| 6,420,698 B1* | 7/2002 | Dimsdale | G01S 7/4811 250/205 |
| 6,526,156 B1* | 2/2003 | Black | G06K 9/32 382/103 |
| 6,580,821 B1* | 6/2003 | Roy | G06K 9/00288 382/118 |
| 6,816,755 B2* | 11/2004 | Habibi | B25J 9/1697 318/568.11 |
| 6,956,569 B1* | 10/2005 | Roy | G06K 9/00208 345/418 |
| 7,167,583 B1* | 1/2007 | Lipson | G06T 7/001 382/147 |
| 7,239,929 B2* | 7/2007 | Ulrich | G06K 9/468 345/420 |
| 8,830,229 B2* | 9/2014 | Drost | G06K 9/6211 345/419 |
| 10,018,893 B2* | 7/2018 | Malrat | G06T 7/80 |
| 10,970,425 B2* | 4/2021 | Yang | G06T 7/75 |
| 2001/0020946 A1* | 9/2001 | Kawakami | G06K 9/6206 345/582 |
| 2002/0061130 A1* | 5/2002 | Kirk | G06T 7/80 382/154 |
| 2002/0181780 A1* | 12/2002 | Simon | G06K 9/6211 382/209 |
| 2003/0095120 A1* | 5/2003 | Koppe | G06T 19/00 345/419 |
| 2003/0123713 A1* | 7/2003 | Geng | G06K 9/00288 382/118 |
| 2004/0175041 A1* | 9/2004 | Miller | G06K 9/00288 382/190 |
| 2005/0117215 A1* | 6/2005 | Lange | G03B 35/00 359/462 |
| 2005/0286767 A1* | 12/2005 | Hager | G06K 9/00208 382/190 |
| 2008/0025568 A1* | 1/2008 | Han | G06K 9/4642 382/103 |
| 2009/0096790 A1* | 4/2009 | Wiedemann | G06K 9/00201 345/427 |
| 2010/0030531 A1* | 2/2010 | Merlhiot | B25J 9/1666 703/2 |
| 2011/0102596 A1* | 5/2011 | Kotani | H04N 13/204 348/159 |
| 2011/0206274 A1* | 8/2011 | Tateno | G06T 7/75 382/154 |
| 2011/0211066 A1* | 9/2011 | Fujiki | G06T 7/75 348/135 |
| 2011/0273442 A1* | 11/2011 | Drost | G06K 9/6211 345/419 |
| 2012/0033071 A1* | 2/2012 | Kobayashi | G01B 11/25 348/139 |
| 2012/0092342 A1* | 4/2012 | Suzuki | G06T 15/205 345/420 |
| 2012/0121132 A1* | 5/2012 | Asahara | G06K 9/00201 382/103 |
| 2012/0182403 A1* | 7/2012 | Lange | H04N 13/388 348/51 |
| 2012/0229445 A1* | 9/2012 | Jenkins | G06T 15/405 345/418 |
| 2012/0316680 A1 | 12/2012 | Olivier, III et al. | |
| 2013/0156262 A1* | 6/2013 | Taguchi | G06T 7/521 382/103 |
| 2014/0105506 A1* | 4/2014 | Drost | G06K 9/00201 382/199 |
| 2014/0320120 A1* | 10/2014 | Klimenko | G01B 7/30 324/207.25 |
| 2015/0098075 A1* | 4/2015 | Bestler | G01C 15/002 356/3.01 |
| 2015/0161812 A1* | 6/2015 | Weill | G06T 15/04 345/419 |
| 2015/0199572 A1* | 7/2015 | Kim | G06T 7/251 382/103 |
| 2015/0363971 A1* | 12/2015 | Pan | G06T 7/593 345/420 |
| 2016/0037149 A1* | 2/2016 | Nishikawa | G06T 11/001 348/46 |
| 2016/0335792 A1* | 11/2016 | Forutanpour | G06T 19/00 |
| 2016/0335809 A1* | 11/2016 | Forutanpour | G06T 7/579 |
| 2016/0379083 A1* | 12/2016 | Sala | G06T 7/75 345/633 |
| 2017/0026636 A1* | 1/2017 | Zahn | G06T 7/73 |
| 2017/0089726 A1* | 3/2017 | Scherr | G01D 5/145 |
| 2017/0098139 A1* | 4/2017 | Protter | G06T 7/0004 |
| 2017/0243372 A1* | 8/2017 | Iida | G06T 7/13 |
| 2017/0286750 A1* | 10/2017 | Levinshtein | G06K 9/6202 |
| 2017/0372466 A1* | 12/2017 | Hirota | H04W 84/06 |
| 2018/0137651 A1* | 5/2018 | Levinshtein | G06T 7/75 |
| 2018/0365853 A1* | 12/2018 | Yang | G06T 7/75 |
| 2019/0087976 A1* | 3/2019 | Sugahara | G06K 9/6274 |
| 2019/0197196 A1* | 6/2019 | Yang | G06F 30/00 |

OTHER PUBLICATIONS

"Rotational Subgroup Voting and Pose Clustering for Robust 3D Object Recognition;" Buch, Anders Glent; Kiforenko, Lilita; Kraft, Dirk; 2017 IEEE International Conference on Computer Vision (ICCV); Sep. 7, 2017.*

Kitago, M., & Gopi, M. (Jul. 2006). Efficient and Prioritized Point Subsampling for CSRBF Compression. In SPBG (pp. 121-128).

Drost, Bertram, Markus Ulrich, Nassir Navab, and Slobodan Ilic. "Model Globally, Match Locally: Efficient and Robust 3D Object Recognition." (2010). pp. 998-1005.

Grewe, Lynne, and Avinash C. Kak. "Interactive Learning of a Multiple-Attribute Hash Table Classifier for Fast Object Recognition." Computer Vision and Image Understanding 61, No. 3 (1995): pp. 387-416.

Winkelbach, Simon, Sven Molkenstruck, and Friedrich M. Wahl. "Low-Cost Laser Range Scanner and Fast Surface Registration Approach." In Pattern Recognition, pp. 718-728. Springer Berlin Heidelberg, 2006.

Rusinkiewicz, Szymon, and Marc Levoy. "Efficient Variants of the ICP Algorithm." In 3-D Digital Imaging and Modeling, 2001. Proceedings. Third International Conference on, pp. 145-152. IEEE, 2001.

* cited by examiner

METHODS AND APPARATUS FOR DETERMINING THE POSE OF AN OBJECT BASED ON POINT CLOUD DATA

BACKGROUND

In performing various robotic tasks, it may be beneficial and/or necessary for robots to detect environmental objects and estimate poses (positions and orientations) for those detected objects. For example, an automated pallet jack robot needs to know a pallet's pose before picking it up, a robot needs to know an object's pose before determining how best to pick it up (e.g., with a robotic arm of the robot), etc. As used herein, a "pose" of an object references both a position of the object and an orientation of the object. For example, the pose of an object may describe the state of each of six degrees of freedom of the object.

Various techniques have been utilized for detecting objects and estimating their poses. For example, a robot may have access to a complete three-dimensional ("3D") model of an object that was generated from a CAD model of the object and/or using a 3D scanner to scan the object from all different angles and combining all the scans together to compute the complete 3D model. The robot may acquire data from a 3D laser scanner or other 3D vision sensor (e.g., stereographic camera) viewing a portion of the robot's environment, and map such data to the complete 3D model to determine the object is present in the environment and to estimate the object's pose in the environment.

SUMMARY

The present disclosure is generally directed to on one or more techniques that are applicable to 3D object detection and pose determination and that may optionally increase the robustness and/or efficiency of the 3D object recognition and pose determination. As used herein, robustness refers to the ability to detect an object and/or determine the pose of an object and/or refers to the accuracy of such detection and/or determination. For example, robustness may reference the ability to detect an object and/or determine the pose of an object in challenging environments such as environments with a relatively large amount of background clutter, a relatively large amount of occlusion, etc. As used herein, efficiency refers to time and/or computer resources used in detecting an object and/or determining the pose of an object.

Some implementations of the present disclosure are generally directed to techniques for generating an object model of an object based on model point cloud data of the object, such as model point cloud data generated using a 3D scanner to scan the object from multiple angles and/or point cloud data generated from a computer-aided design (CAD) model of the object. The generated object model of the object can be used for recognition of the object in an environment and/or for determination of the pose of the object in the environment. For example, acquired scene point cloud data of an environment may be applied to the object model to detect the object in the environment and/or determine the pose of the object in the environment. The 3D scene point cloud data may be sensed by a three-dimensional vision sensor, such as a 3D laser scanner or a stereo camera (e.g., a 3D vision sensor of a mobile robot or a stationary 3D vision sensor). Some implementations of the present disclosure are additionally and/or alternatively directed to techniques for application of acquired scene point cloud data to a stored object model of an object to detect the object and/or determine the pose of the object.

In some implementations, a method implemented by one or more processors is provided that includes: identifying scene point cloud data that captures at least a portion of an object in an environment; identifying a bounding measure for one or more dimensions of the object; and selecting a scene reference point from the scene point cloud data. The method further includes selecting, from the scene point cloud data, an additional scene point to pair with the scene reference point as a scene point pair in generating a candidate in-plane rotation. Selecting the additional scene point is based on a distance between the scene reference point and the additional scene point satisfying the bounding measure. The method further includes: identifying, from a stored model of the object, a model point pair based on one or more features of the scene point pair; generating the candidate in-plane rotation based on the model point pair and the scene point pair; and determining a pose of the object in the environment based on the generated candidate in-plane rotation and a model reference point of the model point pair.

This method and other implementations of technology disclosed herein may each optionally include one or more of the following features.

In some implementations the method further includes: casting, for the scene reference point, a vote for the candidate in-plane rotation and the model reference point; and determining a candidate pose for the scene reference point based on one or more voting peaks in votes cast for the scene reference point. The votes cast for the scene reference point include the vote for the candidate in-plane rotation and the model reference point and include one or more additional votes for the candidate in-plane rotation and the model reference point and/or for different candidate in-plane rotations and/or model reference points. In some of those implementations, determining the pose of the object in the environment based on the generated candidate in-plane rotation and the model reference point of the model point pair includes determining the pose based on the candidate pose for the scene reference point. For example, the pose may be determined based on the candidate pose for the scene reference point and based on candidate poses for additional scene reference points.

In some implementations, the bounding measure is based on a maximum diameter of the object. In some of those implementations, the bounding measure is the maximum diameter of the object and/or is defined as a bounding shape.

In some implementations, the bounding measure is identified from the stored object model of the object.

In some implementations, the bounding measure is a minimum bounding measure based on a minimum dimension of the object and selecting the scene point pair includes selecting the scene point pair for inclusion in a group of minimum bound scene point pairs for the scene reference point. In some of those implementations, the method further includes: casting, for the scene reference point, a vote for the candidate in-plane rotation and the model reference point; and determining a candidate pose for the scene reference point based on one or more voting peaks in votes cast for the scene reference point. The votes include the vote for the candidate in-plane rotation and the model reference point and determining the pose of the object in the environment based on the generated candidate in-plane rotation and the model reference point of the model point pair includes determining the pose based on the candidate pose for the scene reference point. In some version of those implementations, the method further includes: selecting, from the scene point cloud data, a plurality of additional minimum bound scene point pairs for inclusion in the group of minimum bound scene point pairs, where each of the additional minimum bound scene point pairs includes the scene reference point and a corresponding additional scene point selected based on satisfying the minimum bounding measure; identifying, from the stored object model of the object, additional model point pairs for the additional minimum bound scene point pairs of the group of minimum bound scene point pairs; generating additional candidate in-plane rotations for the object based on the additional model point pairs and the additional minimum bound scene point pairs; and casting, by one or more of the processors for the scene reference point, additional votes of the votes, the additional votes being for the additional candidate in-plane rotations and model reference points of the additional model point pairs.

In some further versions of those implementations, the method further includes: identifying an additional bounding measure for the object that is larger than the minimum bounding measure (e.g., identifying a maximum bounding measure based on a maximum dimension of the object); selecting, from the scene point cloud data, a plurality of larger bound scene point pairs for inclusion in a group of larger bound scene point pairs, where each of the larger bound scene point pairs includes the scene reference point and a larger bound scene point selected based on satisfying the additional bounding measure but not satisfying the minimum bounding measure; identifying, from the stored object model of the object, larger bound model point pairs for the larger bound scene point pairs of the group of larger bound scene point pairs; and generating, by one or more of the processors, larger bound candidate in-plane rotations based on the larger bound model point pairs and the larger bound scene point pairs; where determining the pose of the object in the environment is further based on one or more of the larger bound candidate in-plane rotations and larger bound model reference points of the larger bound model point pairs. In some yet further versions of those implementations, the method further includes: casting, for the scene reference point, additional votes for the larger bound candidate in-plane rotations and the larger bound model reference points; and determining an additional candidate pose for the scene reference point based on one or more voting peaks in a vote group that includes the votes and the additional votes; where determining the pose of the object in the environment further based on one or more of the larger bound candidate in-plane rotations and larger bound model reference points of the larger bound model point pairs includes determining the pose based on the additional candidate pose for the scene reference point. For example, determining the pose of the object in the environment based on the candidate pose for the scene reference point and the additional candidate pose for the scene reference point may include: using both the candidate pose and the additional candidate pose during clustering of candidate in-plane rotations, and using the clustering to determine the pose of the object in the environment.

In some implementations, the method further includes adjusting one or more actuators of a robot based on the determined pose of the object.

In some implementations, a method implemented by one or more processors is provided that includes: identifying scene point cloud data that captures at least a portion of an object in an environment; selecting, from the scene point cloud data, a plurality of scene point pairs that each include a scene reference point and a corresponding additional scene point; and identifying a model point pair for each of the scene point pairs. Each of the model point pairs is identified from a stored model of the object based on one or more features of a corresponding one of the scene point pairs. The method further includes generating a plurality of scene reference point candidate in-plane rotations based on the model point pairs and the scene point pairs. Each of the scene reference point candidate in-plane rotations is generated based on a corresponding one of the model point pairs and a corresponding one of the scene point pairs. The method further includes determining a candidate pose for the scene reference point based on a group of the scene reference point candidate in-plane rotations and their model reference points. Determining the candidate in-plane rotation based on the group of the scene reference point candidate in-plane rotations includes: including a first instance of a given candidate scene reference point in-plane rotation of the candidate scene reference point in-plane rotations in the group and excluding a second instance of the given candidate scene reference point in-plane rotation from the group. The first instance of the given candidate scene reference point in-plane rotation is generated based on a given model point pair of the model point pairs and the second instance is excluded from the group based on the second instance of the given scene reference point candidate in-plane rotation also being based on the given model point pair.

This method and other implementations of technology disclosed herein may each optionally include one or more of the following features.

In some implementations, including the first instance of a given candidate scene reference point in-plane rotation of the candidate scene reference point in-plane rotations in the group includes: casting a vote based on the first instance, the vote being for the given candidate scene reference point in-plane rotation for a given model reference point of a given model point pair of the model point pairs, the given model point pair being utilized to generate the given candidate scene reference point in-plane rotation. In some of those implementations, excluding the second instance of the given candidate scene reference point in-plane rotation from the group includes: preventing the casting of an additional vote based on the second instance, the additional vote being for the given candidate scene reference point in-plane rotation for the given model reference point. In some versions of those implementations, the method further includes: assigning, in response to including the first instance in the group, a value assigned to a database identifier of the given model point pair and the given candidate scene reference point in-plane rotation; where excluding the second instance of the given candidate scene reference point in-plane rotation from the group is based on identifying the value as assigned to the database identifier of the given model point pair and the given candidate scene reference point in-plane rotation. The database identifier may be, for example, a multi-bit value indexed by the given model point pair and the assigning may be, for example, assigning the value to one of the bits of the multi-bit value.

In some implementations, the method further includes identifying a bounding measure for one or more dimensions of the object and the selecting the plurality of scene point pairs that each include a scene reference point and a corresponding additional scene point may include selecting the additional scene points based on the additional scene points satisfying the bounding measure.

In some implementations, a method implemented by one or more processors is provided that includes: obtaining a three-dimensional point cloud of an object; selecting, from the three-dimensional point cloud, a model point pair that includes a model reference point and an additional model point; and generating a feature vector for the model point pair based on one or more features of the model point pair. The feature vector defines a plurality of features and defines the plurality of features at corresponding discretization levels. The method further includes: storing, in one or more non-transitory computer readable media, a mapping of the feature vector to the model point pair; determining an additional feature vector that is the same as the feature vector, but that includes a given value of the values that varies from the feature vector by a single level of the discretization level of the given value; and storing, in the one or more non-transitory computer readable media, a mapping of the feature vector to the additional feature vector or to one or more additional point pairs mapped to by the additional feature vector.

This method and other implementations of technology disclosed herein may each optionally include one or more of the following features.

In some implementations, the mapping of the feature vector to the model point pair is a mapping of a hash value to the model point pair, such as a hash value generated based on the feature vector.

In some implementations, the mapping of the feature vector to the additional feature vector is a mapping of a first hash key to a second hash key, where the first hash key is generated based on the feature vector and the second hash key is generated based on the additional feature vector.

In some implementations, the method further includes: receiving scene point cloud data that captures at least a portion of the object in an environment; determining a pose of the object in the environment based on the scene point cloud data and the mapping of the feature vector to the additional feature vector or to one or more additional point pairs mapped to by the additional feature vector; and adjusting a robot based on the determined pose of the object in the environment. In some of those implementations, determining the pose of the object based on the scene point cloud data and the mapping of the feature vector to the additional feature vector or to one or more additional point pairs mapped to by the additional feature vector includes: determining a scene point pair from the scene point cloud data; determining a feature vector of the scene point pair maps to the feature vector; selecting the one or more additional point pairs based on the mapping of the feature vector to the additional feature vector or to one or more additional point pairs mapped to by the additional feature vector; generating one or more candidate in-plane rotations based on the scene point pair and the one or more additional point pairs; and determining the pose of the object based on the one or more candidate in-plane rotations and reference points of the corresponding point pairs.

Other implementations may include one or more non-transitory computer readable storage media storing one or more object models and/or storing instructions executable by a processor to perform a method such as one or more of the methods described above. Yet another implementation may include a system, such as a robot, that includes memory and one or more processors operable to execute instructions, stored in the memory, to implement one or more modules or engines that, alone or collectively, perform a method such as one or more of the methods described above.

It should be appreciated that all combinations of the foregoing concepts and additional concepts described in greater detail herein are contemplated as being part of the subject matter disclosed herein. For example, all combinations of claimed subject matter appearing at the end of this disclosure are contemplated as being part of the subject matter disclosed herein.

DETAILED DESCRIPTION

Figure 1:
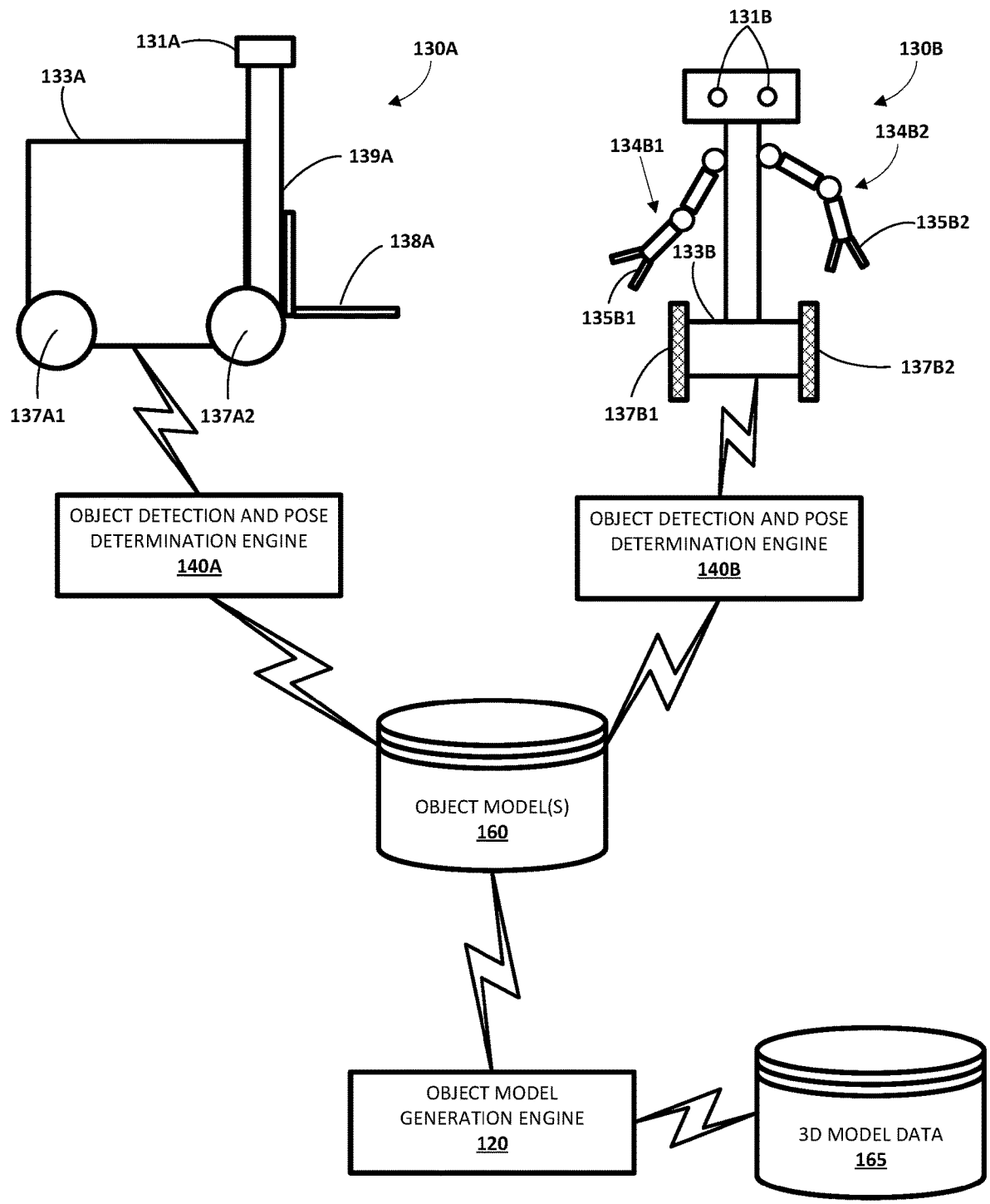
FIG. 1 illustrates an example environment in which an object model that defines an object may be generated and/or in which scene point cloud data may be utilized in combination with the object model to detect the object and/or to determine a pose for the object.

FIG. 1 illustrates an example environment in which an object model that defines an object may be generated and/or in which scene point cloud data may be utilized in combination with the object model to detect the object and/or to determine a pose for the object. The environment includes robot 130A that includes and/or is in network communication with object detection and pose determination engine 140A and robot 130B that includes and/or is in network communication with object detection and pose determination engine 140B. Also provided in the environment of FIG. 1 is an object model generation engine 120, an object models database 160, and a 3D model data database 165. Object models database 160 includes one or more non-transitory computer readable storage media that store generated object models that each define a corresponding object.

In some implementations, one or more (e.g., all) of the object models of database 160 may be stored in one or more non-transitory computer readable storage media of the robot 130A and/or of the robot 130B. In some implementations, one or more (e.g., all) of the object models of database 160 may be stored in one or more non-transitory computer readable storage media that are separate from the robot 130A and/or robot 130B, and the robot 130A and/or robot 130B may access those object models via a direct connection to the one or more media and/or via one or more networks such as a local area network and/or a wide area network (e.g., the Internet).

The robot 130A is a pallet jack robot that includes a plurality of forks 138A coupled to an elevator 139A. The elevator 139A raises and lowers the forks 138A to enable pallets and/or other objects to be lifted off of the ground and repositioned. The robot 130A also includes a base 133A with four wheels (wheels 137A1 and 137A2 are illustrated) provided thereon for locomotion of the robot 130A. The base 133A may include, for example, one or more motors for driving corresponding wheels to achieve a desired direction, velocity, and/or acceleration of movement for the robot 130A.

The robot 130A also includes various sensors such as three-dimensional vision sensor 131A, which is a 3D laser scanner in the illustrated embodiment. A 3D laser scanner includes one or more lasers that emit light and one or more sensors that collect data related to reflections of the emitted light. A 3D laser scanner may be, for example, a time-of-flight 3D laser scanner or a triangulation based 3D laser scanner and may include a position sensitive detector (PSD) or other optical position sensor. The object detection and pose determination engine 140A of the robot 130A utilizes scene point cloud data sensed by the three-dimensional vision sensor 131A and one or more object models of database 160 to detect an object modeled by one of the object models and/or to determine the object pose for that object relative to the robot 130A. Additional description of engine 140A is provided herein. One or more (e.g., all) aspects of the engine 140A may be implemented in hardware of the robot 130A in some implementations. In some implementations, one or more (e.g., all) aspects of the engine 140A may be implemented in hardware separate from the robot 130A. In some of those implementations, the robot 130A may provide data to, and/or receive data from, the engine 140A via one or more networks. In other implementations a direct connection between one or more components may be utilized.

In some implementations, the wheels of the robot 130A may be controlled autonomously and/or semi-autonomously and/or the elevator 139A may be controlled autonomously and/or semi-autonomously. For example, the robot 130A may position itself autonomously based on an object pose determined based on an object model as described herein. For instance, the robot 130A may lift and reposition pallets and the object detection and pose determination engine 140A of the robot 130A may determine the pose of a pallet near the robot 130A according to techniques described herein, and the robot 130A may drive the wheels thereof autonomously and/or adjust the height of the forks 138A autonomously based on the determined pose to enable the robot 130A to position the forks 138A in fork holes of the pallet.

The robot 130A also includes one or more processors that, for example: provide control commands to actuators (e.g., servo motors) and/or other operational components of the robot 130A; implement one or more aspects of object detection and pose determination engine 140A; and/or determine control commands to adjust one or more operational components of the robot 130A based on a pose for an object determined by engine 140A. Additional description of some examples of the structure and functionality of the processor and other components of robot 130A is provided herein.

The robot 130B includes robot arms 134B1 and 134B2 with corresponding end effectors 135B1 and 135B2, that each take the form of a gripper with two opposing "fingers" or "digits." The robot 130B also includes a base 133B with wheels 137B1 and 137B2 provided on opposed sides thereof for locomotion of the robot 130B. The base 133B may include, for example, one or more motors for driving corresponding wheels 137B1 and 137B2 to achieve a desired direction, velocity, and/or acceleration of movement for the robot 130B. Although specific end effectors 135B1 and 135B2 are illustrated, in other implementations robot 130B and/or other robot may include one or more additional or alternative end effectors. For example, other types of "grippers" may be utilized including, for example, other types of "impactive" grippers (e.g., a mechanical hand), "ingressive" grippers (e.g., physically penetrating an object using pins, needles, etc.), "astrictive" grippers (e.g., using suction or vacuum to pick up an object), or "contigutive" (e.g., using surface tension, freezing or adhesive to pick up object). Also, for example, other types of end effectors may be included such as, for example, drills, brushes, cutting tools, deburring tools, welding torches, and so forth.

The robot 130B also includes various sensors such as three-dimensional vision sensor 131B which, is a stereo camera in the illustrated embodiment. A stereo camera includes two or more sensors (e.g., charge-coupled devices (CCDs)), each at a different vantage point and generates, based on the data sensed by the two sensors, 3D scene point cloud data that includes a depth image with a plurality of data points defining depth values. The object detection and pose determination engine 140B of the robot 130B utilizes the scene point cloud data sensed by the 3D vision sensor 131B and one or more object models of database 160 to detect an object modeled by one of the object models and to determine the object pose for that object relative to the robot 130B. Additional description of engine 140B is provided herein. One or more (e.g., all) aspects of the engine 140B may be implemented in hardware of the robot 130B in some implementations. In some implementations, one or more (e.g., all) aspects of the engine 140B may be implemented in hardware separate from the robot 130B. In some of those implementations, the robot 130B may provide data to, and/or receive data from, the engine 140B via one or more networks. In other implementations a direct connection between one or more components may be utilized.

In some implementations, the wheels 137B1, 137B2 of the robot 130B may be controlled autonomously and/or semi-autonomously and/or the robot arms 134B1, 134B2 and end effectors 135B1, 135B2 may be controlled autonomously and/or semi-autonomously. For example, the robot 130B may position itself autonomously based on an object pose determined based on an object model as described herein. Also, for example, robot 130B may autonomously control robot arms 134B1, 134B2 and/or end effectors 135B1, 135B2 based on an object pose as described herein. For instance, the robot 130B may pick up and deliver objects to pallets, the object detection and pose determination engine 140B of the robot 130B may determine the pose of a pallet near the robot 130B according to techniques described herein, and the robot 130B may drive the wheels 137B1 and 137B2 and the arms 134B1 and 134B2 autonomously based on the determined pose to enable the robot 130B to place an object on the pallet.

The robot 130B also includes one or more processors that, for example: provide control commands to actuators and/or other operational components of the robot 130B; implement one or more aspects of object detection and pose determination engine 140B; and/or determine control commands to adjust one or more operational components of the robot 130B based on a pose for an object determined by engine 140B. Additional description of some examples of the structure and functionality of the processor and other components of robot 130B is provided herein.

In some implementations, additional and/or alternative robots may be provided in the environment, such as additional robots that vary in one or more respects from robots 130A and 130B illustrated in FIG. 1. In some of those implementations, each of one or more of the robots may embody all or aspects of an object detection and pose determination engine and/or communicate with all or aspects of such an engine that is separate from the robot. Moreover, in some of those implementations, each of one or more of the robots may have access to, or may embody, one or more object models of database 160. Additionally, in some implementations, one or more apparatus that include at least a 3D vision sensor and that are not attached to a robot may be included in the environment. Such apparatus may embody all or aspects of an object detection and pose determination engine and/or communicate with all or aspects of such an engine, and have access to, or may embody, one or more object models of database 160.

The object model generation engine 120 generates an object model of an object that can be used for recognition of the object and/or determination of the pose of the object. The object model generation engine 120 can generate the object model of the object based on a CAD model of the object and/or based on a point cloud of the object, such as a point cloud generated using a 3D scanner to scan the object from all different angles. The object model generation engine 120 may obtain a CAD model or point cloud data of an object from 3D model data database 165, for example. The object model generation engine 120 generates the object model of the object by generating a feature vector for each of a plurality of model point pairs of the object (point pairs from points of the point cloud or from points generated from the CAD model) and storing mappings of the feature vectors, or values generated based on the feature vectors, to their corresponding model point pairs. For example, the model point pairs can be stored in a database that is indexed by the feature vectors and/or the values generated based on the feature vectors. The values generated based on the feature vectors can be, for example, discretized values of the feature vectors and/or hash keys generated based on the feature vectors. For instance, the object model of an object may be stored as one or more hash tables indexed by hash keys generated based on the feature vectors (i.e., the hash keys are the keys to bins of the hash table that store the corresponding model point pairs). Also, for instance, the object model of an object may be stored as one or more look-up tables indexed by look-up table indices generated based on the feature vectors.

Figure 2:
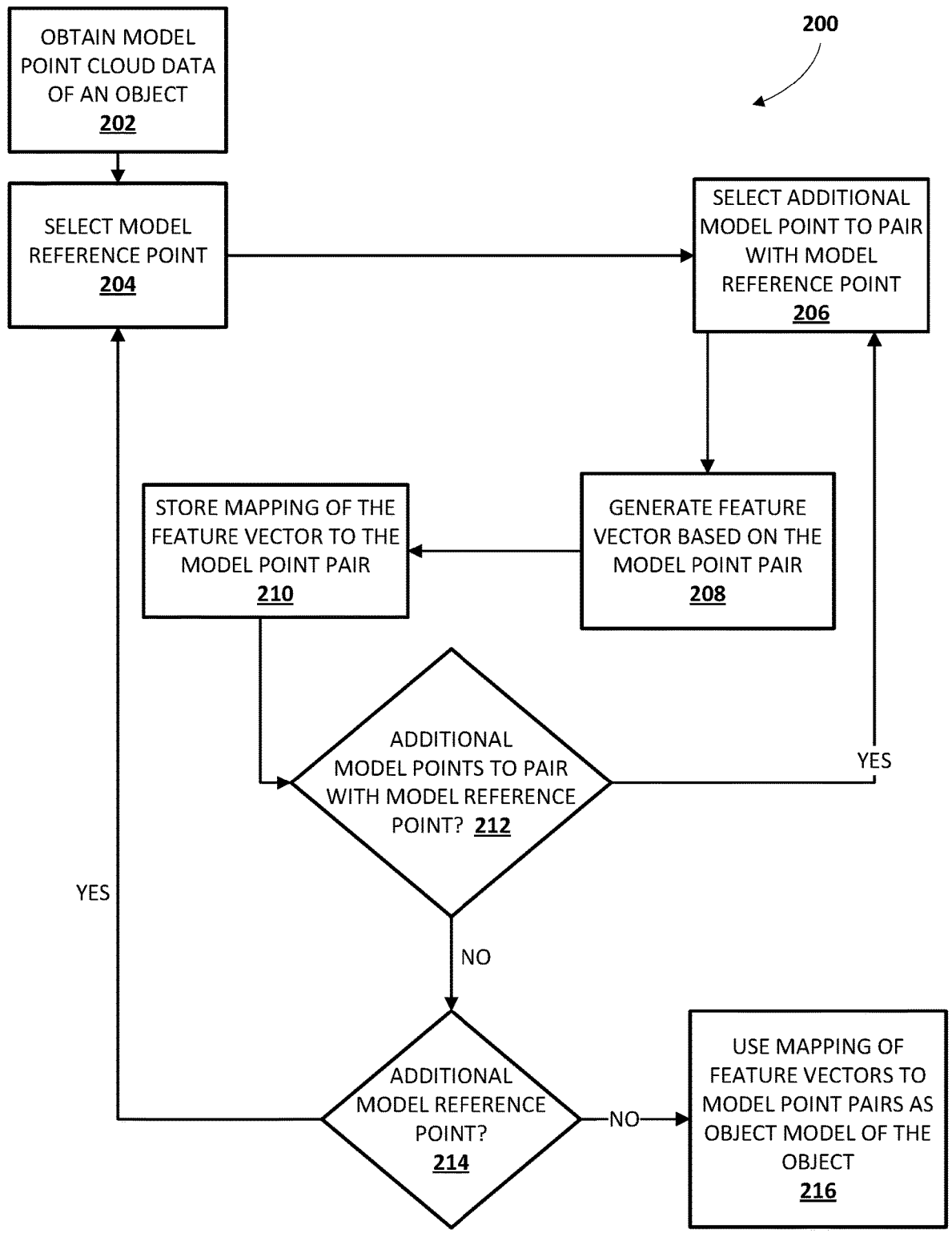
FIG. 2 illustrates an example method of generating an object model of an object based on model point cloud data of the object.
Figure 12:
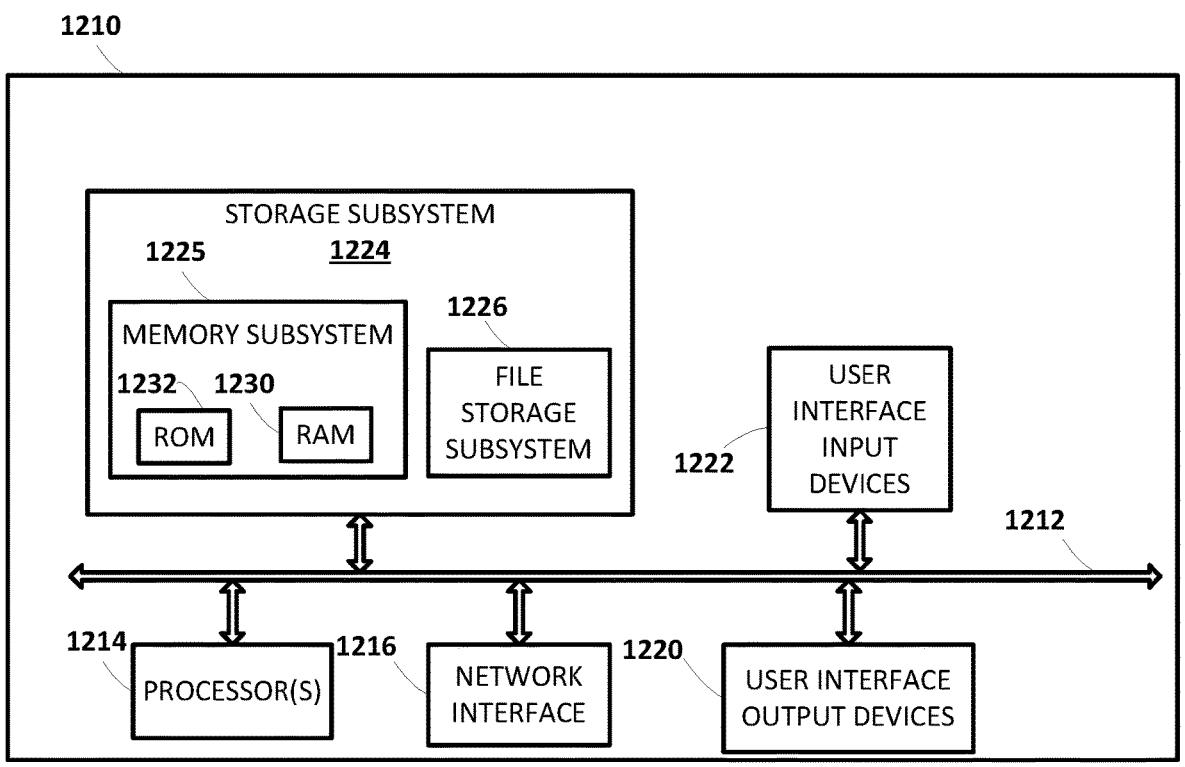
FIG. 12 schematically depicts an example architecture of a computer system.

With reference to FIG. 2, an example method 200 of generating an object model of an object based on model point cloud data of the object is illustrated. For convenience, the operations of the method 200 are described with reference to a system that performs the operations. This system may include various components of various computer systems, such as object model generation engine 120 and/or processor 1214 (FIG. 12). While particular operations of method 200 are shown and are shown in a particular order, this is not meant to be limiting. One or more operations may be reordered, omitted or added. For example, one or more operations may be reordered, omitted, or added as described herein with respect to various techniques related to generating an object model.

At block 202, the system obtains model point cloud data of an object. The model point cloud data of the object is a point cloud of one or more (e.g., all) surfaces of the object, with each of the points of the point cloud defining a position of the point, a normal of the point, and optionally other data such as color information (e.g., R, G, B values). In some implementations, the model point cloud data of the object can be generated from a CAD model of the object and/or based on using a 3D vision sensor to scan the object from multiple angles. In some implementations, at block 202 the model point cloud data of the object may optionally be processed to refine the model data. For example, as described herein, one or more techniques may be utilized to refine the normal for one or more points of the model point cloud data and/or one or more techniques may be utilized to subsample or otherwise regularize the model point cloud data and reduce the quantity of points of the model point cloud data.

At block 204, the system selects a model reference point of the points of the model point cloud data.

At block 206, the system selects an additional model point to pair with the model reference point, thereby forming a model point pair. In some implementations, at block 206 the system may select the additional model point based on one or more criteria. For example, as described herein, in some implementations the system may select an additional model point to pair with the model reference point based on a determination that both of the points are simultaneously visible by a 3D vision sensor at a given time instant. Also, for example, as described herein, in some implementations the system may not select an additional model point to pair with the model reference point based on a determination that both of the points are not simultaneously visible by a 3D vision sensor at a given time instant.

At block 208, the system generates a feature vector based on the model point pair. In some implementations, the feature vector may describe at least the relative position and orientation of the model point pair. One example of features F1, F2, F3, and F4 that may be included in a feature vector of <F1, F2, F3, F4> is illustrated in FIG. 3.

Figure 3:
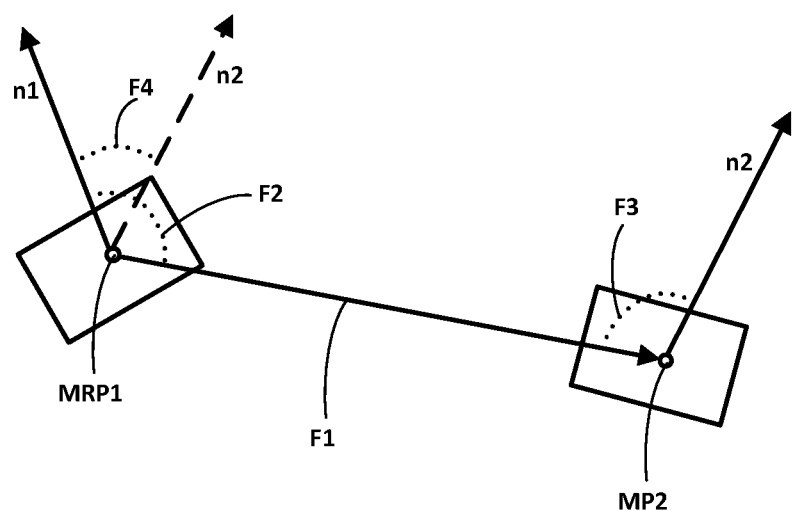
FIG. 3 illustrates a model point pair and example features that may be included in a feature vector for the model point pair.

In FIG. 3, a model point pair is illustrated that includes a model reference point MRP1 having a normal n1 and an additional model point MP2 having a normal n2. Rectangular planes that are perpendicular to the normal n1 and n2 are also illustrated in FIG. 3. A first feature F1 is also illustrated and is the 3D distance between model reference point MRP1 and additional model point MP2. A second feature F2 is also illustrated and is the angle between: (a) the normal n1 of model reference point MRP1 and (b) the vector defined by model reference point MRP1 and additional model point MP2. A third feature F3 is also illustrated and is the angle between: (a) the normal n2 of additional model point MP2 and (b) the vector defined by model reference point MRP1 and additional model point MP2. A fourth feature F4 is also illustrated and is the angle between the normal n1 of model reference point MRP1 and the normal n2 of additional model point MP2. For purposes of clarity in illustrating fourth feature F4, in FIG. 3 the normal n2 is reproduced in broken lines extending from model reference point MRP1. Various levels of discretization may be utilized for one or more (e.g., all) of the features of the feature vectors. Also, although a particular feature vector is illustrated in FIG. 3, additional and/or alternative features may be included. For example, where the model point cloud data includes color information (e.g., R, G, B values) for one or more of the points, one or more features based on color information may be included. Also, for example, an angle between the two normals (of a model point pair) projected to the plane perpendicular to the axis connecting the model point pair may additionally and/or alternatively be included as a feature.

Referring again to FIG. 2, at block 210 the system stores a mapping of the feature vector to the model point pair. Storing a mapping of the feature vector to the model point pair can include storing a mapping to the feature vector itself (e.g., the discretized feature vector) and/or to values generated based on the feature vector, such as a hash key generated based on the feature vector. As one example, the model point pair can be stored in a database and mapped to an index value that is the feature vector and/or the value generated based on the feature vector. In some implementations, at block 210, the system may also store a mapping of one or more additional feature vectors to the model point pair. For example, as described herein, the system may also directly or indirectly map the model point pair to one or more additional feature vectors that are "adjacent" to the feature vector of block 208.

At block 212, the system determines whether there are additional model points to pair with the model reference point of block 204. If so, the system returns to block 206 and selects an additional model point to thereby form an additional model point pair that includes that additional model point and the model reference point. If not, the system proceeds to block 214.

At block 214, the system determines whether there are additional model reference points to select from the model point cloud data of the object. If so, the system returns to block 204 and selects another model reference point to pair with a plurality of additional model points to form additional model point pairs. If not, the system proceeds to block 216.

At block 216, mappings of a plurality of feature vectors to a plurality of model point pairs will have been stored via multiple iterations of blocks 204-214. The multiple iterations may be performed consecutively and/or one or more of the iterations may be performed simultaneously with one another. At block 216, the system uses the mapping of feature vectors to model point pairs as an object model of the object.

As described above, the object model is created by storing the model point pairs in a database that is indexed by the generated feature vectors and/or values based on the feature vectors. For example, the model point pairs with the same and/or similar feature vectors may be grouped together in the object model and those model point pairs indexed by the corresponding feature vector and/or a value based on the corresponding feature vector. For instance, two or more model point pairs may have the same feature vector and those model point pairs may be indexed in the object model by the same feature vector. As also described above, in some implementations, the object model of an object may be stored as a hash table indexed by hash keys generated based on the feature vectors (i.e., the hash keys are the keys to bins of the hash table that store the corresponding model point pairs)—or as one or more look-up tables indexed by look-up table indices generated based on the feature vectors.

In some implementations, an object model may further include an object identifier that identifies a category and/or other class identifier of the object and/or that otherwise identifies the object. In some of those implementations, the object identifier can be used by a robot to determine how to interact with an object that is detected based on the model. In some implementations, as described herein, an object model may further define one or more bounding measures for the object. Bounding measures, object identifiers, and/or other additional data may be stored, for example, in an additional bin of the object model.

As one specific example of an object model: Model Point Pair1, Model Point Pair2, and Model Point Pair3 may be indexed by Feature Vector1, Model Point Pair4 and Model Point Pair5 may be indexed by Feature Vector2, and so forth. Table 1 illustrates this example of an object model and is presented below, with the left column representing feature vectors or other index values (e.g., hash keys generated based on the feature vectors), and the right column representing model point pairs/bin values indexed by the feature vectors.

TABLE 1

| Object Model | |
| --- | --- |
| Feature Vectors (FV) | Model Point Pair(s) (MPP) |
| FV1 | {MPP1, MPP2, MPP3} |
| FV2 | {MPP4, MPP5} |
| FV3 | MPP6 |
| ... | ... |
| FVn | {..., MPPn} |

The object detection and pose determination engine 140A or 140B utilizes scene point cloud data in combination with an object model of an object to detect the object in an environment and/or to determine the pose of the object in the environment. The scene point cloud data may be obtained using a 3D vision sensor that views the environment that includes the object. For example, object detection and pose determination engine 140A may obtain scene point cloud data from 3D vision sensor 131A.

Figure 4:
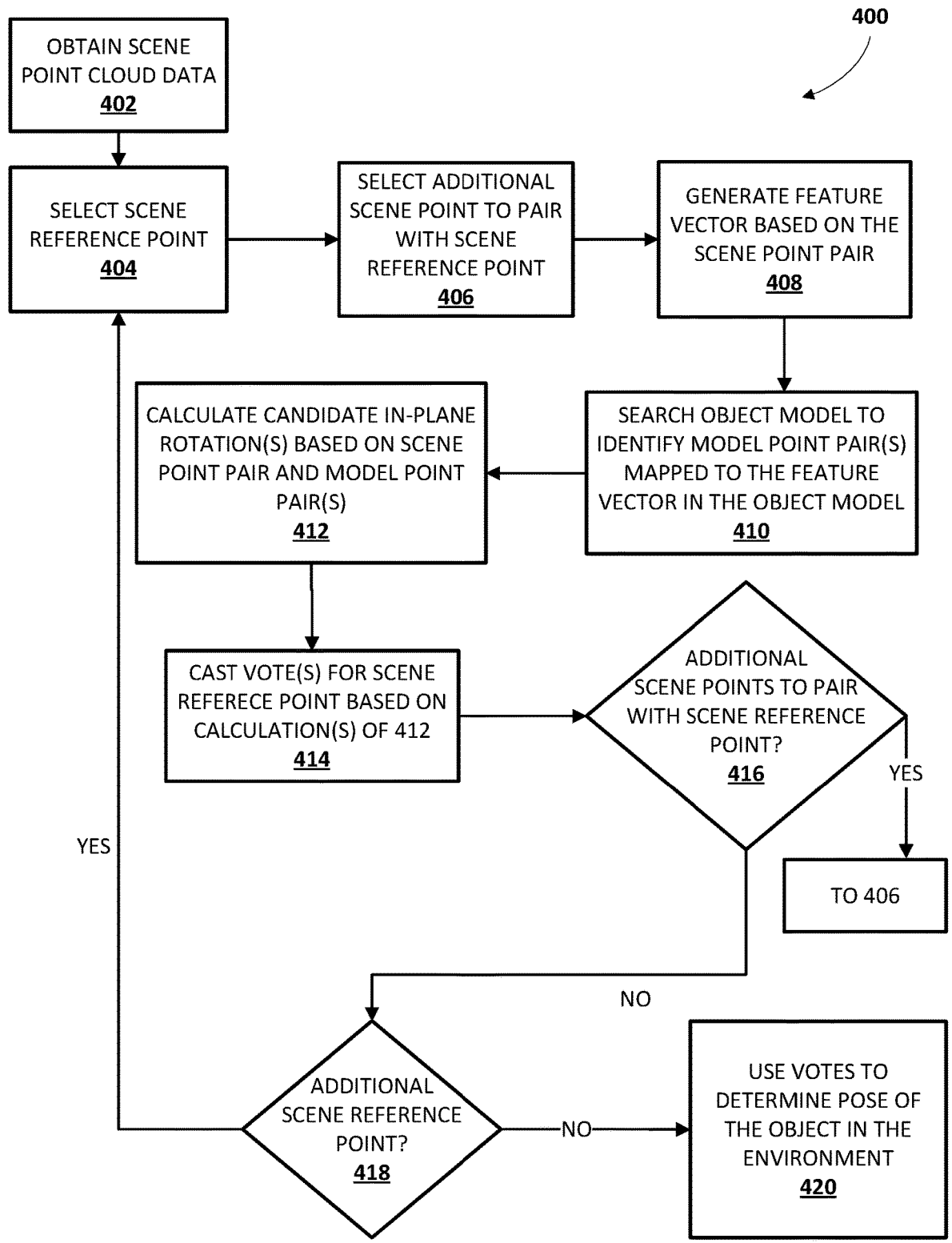
FIG. 4 illustrates an example method of determining the pose of an object based on scene point cloud data and an object model of the object.
Figure 11:
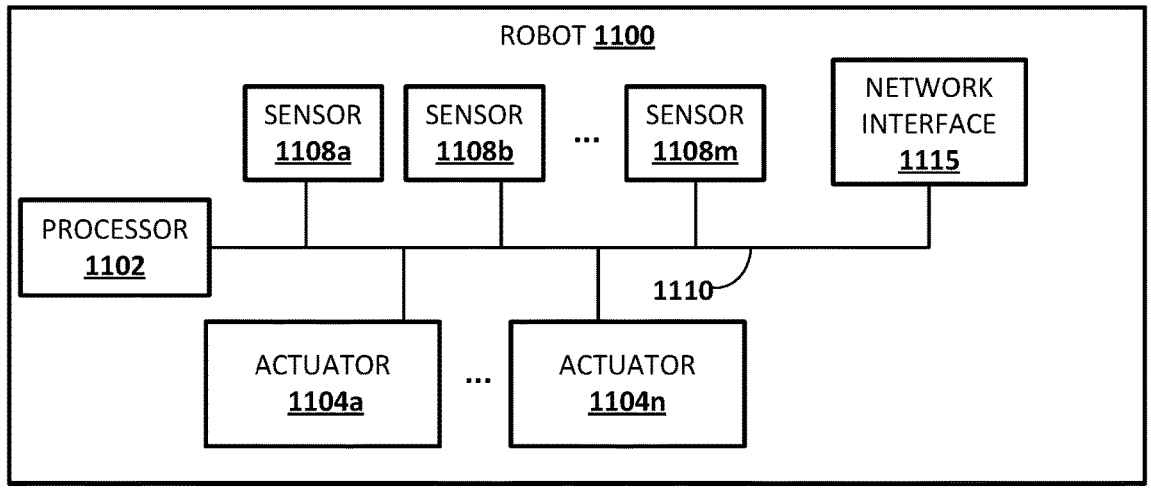
FIG. 11 schematically depicts an example architecture of a robot.

With reference to FIG. 4, an example method 400 of determining the pose of an object based on scene point cloud data and an object model of the object is illustrated. For convenience, the operations of the method 400 are described with reference to a system that performs the operations. This system may include various components of various computer systems, such as object detection and pose determination engine 140A or 140B, and/or processor 1102 (FIG. 11).

While particular operations of method 400 are shown and are shown in a particular order, this is not meant to be limiting. One or more operations may be reordered, omitted or added. For example, one or more operations may be reordered, omitted, or added as described herein with respect to various techniques related to detecting an object and/or determining the pose of the object based on scene point cloud data and an object model of the object.

At block 402, the system obtains scene point cloud data, such as scene point cloud data from a 3D vision sensor of a robot or a 3D vision sensor that is separate from a robot. The scene point cloud data is a point cloud that captures surfaces in the field of view of the 3D vision sensor at one or more time instants. In some implementations, at block 402 the scene point cloud data of the object may optionally be processed to refine the scene point cloud data. For example, as described herein, one or more techniques may be utilized to refine the normal for one or more points of a point set and/or one or more techniques may be utilized to subsample or otherwise regularize the scene point cloud data and reduce the quantity of points of the scene point cloud data.

At block 404, the system selects a scene reference point of the points of the scene point cloud data.

At block 406, the system selects an additional scene point to pair with the scene reference point for consideration of the scene point pair in one or more further blocks. In some implementations, at block 406 the system may select the additional scene point based on one or more criteria. For example, as described herein, in some implementations the system may select an additional scene point to pair with the scene reference point based on a distance between the scene reference point and the additional scene point satisfying a bounding measure, such as a bounding measure for one or more dimensions of the object.

At block 408, the system generates a feature vector based on the scene point pair. In some implementations, the feature vector includes the same features as the feature vectors utilized in generating the object model to be searched at block 410. In some implementations, the feature vector may describe at least the relative position and orientation of the model point pair. One example of features F1, F2, F3, and F4 that may be included in a feature vector of <F1, F2, F3, F4> is illustrated in FIG. 3 and is described above with respect to block 208 of FIG. 2. Various levels of discretization may be utilized for one or more (e.g., all) of the features of the feature vectors.

At block 410, the system searches the object model to identify model point pair(s) mapped to the feature vector in the object model. As described herein, the object model includes mappings of feature vectors to corresponding model point pairs, which can be mappings of the feature vectors themselves and/or to values generated based on the feature vectors, such as a hash keys generated based on the feature vectors. Searching the object model can include searching the object model based on the feature vector itself or a value generated based on the feature vector, such as a hash key. The system locates the feature vector or value and identifies the model point pair(s) (if any) that are indexed by, or otherwise mapped to, the feature vector in the object model. As one example, Feature Vector1 for Scene Reference Point1 paired with Additional Scene Point2 may be indexed in the object model to model point pairs of {Model Point1, Model Point2} and {Model Point24, Model Point34}.

In some implementations, at block 410, the system may also identify model point pair(s) that are mapped to one or more "adjacent" feature vectors in the object model. For example, as described herein, the object model may include, for each of a plurality of feature vectors and/or for bins indexed by those feature vectors, pointers or other mappings to adjacent feature vectors, and the system may also identify model point pair(s) that are mapped to those adjacent feature vectors.

At block 412, the system calculates candidate in-plane rotation(s) based on the scene point pair and based on the model point pair(s) identified at block 410. Various levels of discretization may be utilized for the candidate in-plane rotations. Each candidate in-plane rotation defines the in-plane rotation to align the normals of a corresponding scene point pair to the normals of a corresponding model point pair after the scene point pair and the model point pair have been aligned. As described herein, in some implementations one or more techniques may be utilized to increase the efficiency of calculating candidate in-plane rotations.

At block 414, the system casts vote(s) based on the calculations of block 412. For example, votes are cast for candidate in-plane rotation(s) of block 412 and their corresponding model reference points of the model point pairs. In other words, a given vote is cast for a given candidate in-plane rotation and a model reference point of a given model point pair on which the given candidate in-plane rotation is based. For instance, assume a first candidate in-plane rotation was calculated at block 412 based on the scene point pair and a first model point pair. At block 414, a vote may be cast for the first candidate in-plane rotation for the model reference point of the first model point pair. If additional candidate in-plane rotations were also calculated at block 412 based on the scene point pair and additional model point pairs, votes may also be cast for those (i.e., each additional vote would be for the corresponding additional candidate in-plane rotation and the model reference point of the corresponding model point pair).

As described herein, in some implementations, at block 414 the system may perform consistency checking to prevent multiple votes from being cast for a candidate in-plane rotation based on the same scene reference point and the same model point pair. For example, if a vote has already been cast for a given candidate in-plane rotation calculated based on a given scene reference point and a given model point pair, the system may not cast another vote for the given candidate in-plane rotation if it was also calculated based on the given scene reference point (i.e., another scene point pair that includes the given scene reference point) and the given model point pair. As also described herein, in some implementations, in addition to voting for a calculated candidate in-plane rotation at block 414, the system may also vote for one or more "adjacent" candidate in-plane rotations. For example, where a vote is cast for a given model reference point and a given candidate in-plane rotation, additional votes may also be cast for the given model reference point and additional candidate in-plane rotations that are adjacent to the given candidate in-plane rotation, such as additional candidate in-plane rotations that are one discretization step away.

At block 416, the system determines whether there are additional scene points to pair with the scene reference point of block 404. If so, the system returns to block 406 and selects an additional scene point to thereby form an additional scene point pair that includes that additional scene point and the scene reference point. If not, the system proceeds to block 418.

At block 418, the system determines whether there are additional scene reference points to select from the scene point cloud data. If so, the system returns to block 404 and selects another scene reference point to pair with a plurality of additional scene points to form additional scene point pairs. If not, the system proceeds to block 420.

At block 420, multiple votes will have been cast and stored at block 414 via multiple iterations of blocks 404-418, and those multiple votes will be based on multiple scene point pairs for each of a plurality of scene reference points. For example, multiple votes will have been cast and stored at block 414 for a first scene reference point (with each of the votes being based on a corresponding scene point pair that includes the first scene reference point), multiple votes will have been cast and stored at block 414 for a second scene reference point (with each of the votes being based on a corresponding scene point pair that includes the second scene reference point), and so forth. The multiple iterations of block 404-418 may be performed consecutively and/or one or more of the iterations may be performed simultaneously with one another.

At block 420, the system uses the votes cast in multiple iterations of block 414 to determine a pose of the object in the environment. For example, the system may identify, for each of a plurality of the scene reference points, one or more voting "peaks" from the votes cast for the scene reference point. Each voting peak for a scene reference point indicates a local maximum of votes for a model reference point and candidate in-plane rotation. For each of the peaks, the system may determine a candidate alignment translation based on the scene reference point and the model reference point for the peak. Each candidate alignment translation defines the translation to align the position of a scene point pair to a corresponding model point pair. Collectively, the candidate in-plane rotation, a candidate rotation, and the candidate alignment translation for a voting peak of a scene reference point identifies a candidate pose of the object for that voting peak. The candidate rotation of a voting peak is defined by the candidate in-plane rotation of the voting peak and by a rotation transformation that comes from aligning the model reference point to the scene reference point and by aligning their normals. One or more of the candidate pose(s) for the voting peaks of a scene reference point may be utilized to determine a candidate pose of the object for that scene reference point. Based on the determined candidate poses (e.g., translations and rotations) for a plurality of the scene reference points, the system may determine a pose of the object in the environment. The system may utilize various techniques to determine the actual pose, such as clustering, averaging, etc. For example, in some implementations, a clustering technique may be utilized such as the clustering technique described in detail herein. As also described herein, in some implementations multiple bounding measures of an object may be considered during multiple iterations of the voting of block 414 and/or in determining the pose of the object at block 420.

Table 2 illustrated below provides one specific example of "votes" that may be cast for candidate in-plane rotations and model reference points for a given scene reference point based on multiple iterations of blocks 406-416. The leftmost column represents the model reference point of model point pairs utilized to calculate the candidate in-plane rotations based on scene point pairs that include the given scene reference point, and the other columns represent different in-plane rotations. The different in-plane rotations represented by angles Angle 1, Angle 2, . . . Angle n may each represent a discretized in-plane rotation. The values in the table represent the quantity of votes cast for the corresponding model reference point and candidate in-plane rotation for the given scene reference point. For example, in Table 2, thirty votes were cast for model reference point "MP2" and candidate in-plane rotation "Angle 3." In other words, through multiple iterations of block 406-416, candidate in-plane rotation "Angle 3" was calculated at block 412 based on a scene point pair that included the given scene reference point and based on a model point pair that included model reference point "MP2." In Table 2, model reference point "MP2" and angle "Angle 3" represent a "maximum peak" as the most votes (30) have been cast for model reference point "MP2" and "Angle 3".

TABLE 2

| Votes for a Given Scene Reference Point | | | | | |
|---|---|---|---|---|---|
| Model Reference Point | Angle 1 | Angle 2 | Angle 3 | . . . | Angle n |
| MP1 | 0 | 0 | +12 | . . . | 0 |
| MP2 | 0 | +12 | +30 | . . . | 0 |
| MP3 | +1 | +4 | +18 | . . . | 0 |
| . . . | . . . | . . . | . . . | . . . | 0 |
| MPn | 0 | 0 | 0 | | 0 |

As described above, the system may utilize various techniques to determine a pose based on the votes of Table 2 and based on votes for additional scene reference points. For example, as described above, model reference point "MP2" and candidate in-plane rotation "Angle 3" may be selected as a "maximum peak" for the given scene reference point—and the model reference point and the candidate in-plane rotation may be utilized to determine a candidate pose for the given scene reference point. Additional candidate poses for additional scene reference points may also be determined in a similar manner based on maximum voting peaks for those scene reference points. A pose for the object in the environment may be determined as a function of the candidate poses for a plurality of the scene reference points. For example, the candidate poses for the scene reference points may be averaged. Also, for example, clustering of the scene reference points and their candidate poses may be utilized to determine the pose for the object. In some implementations, one or more post-processing techniques may be utilized to refine a determined pose, such as refinement with projective point-plane iterative closest point (ICP) and verification.

In some implementations where the system is incorporated in a robot and/or is in communication with a robot, the system adjusts the robot based on determining the object is present and/or based on the determined pose of the object. For example, the system may provide one or more control commands to one or more actuators of the robot to position the robot and/or one or more operational components of the robot based on a determined pose. For instance, a pallet jack robot may drive wheels thereof autonomously and/or adjust the height of forks thereof autonomously based on a determined pose for a pallet to enable the robot to position the forks in fork holes of the pallet.

In some implementations, the system additionally or alternatively may localize the robot based on the determined pose of the object. For example, if the absolute object pose is known (e.g., if a pose for the object relative to a reference-frame such as a so-called world frame is stored in a database or otherwise known), the system may determine the absolute pose of the robot based on the determined pose of the object relative to the robot and the absolute object pose. In other words, the system may determine the pose of the robot in a reference frame based on both the determined pose of the object relative to the robot and the absolute pose of the object in the reference frame.

Considering Bounding Measure(s) of an Object

As described herein, in some implementations object detection and pose determination engine 140A or 140B selects a plurality of scene reference points of scene point cloud data and, for each of the scene reference points, generates feature vectors for a plurality of scene point pairs that each include the scene reference point and a corresponding additional scene point from the scene point cloud data. For each feature vector for a scene reference point, engine 140A or 140B searches an object model for the feature vector (or a value based on the feature vector), and the model point pair(s) (if any) that are indexed by the feature vector (or value) are identified—and used to calculate candidate in-plane rotations and vote for the candidate in-plane rotations and their corresponding model reference points.

In some implementations, object detection and pose determination engine 140A or 140B may consider one or more bounding measures of the object under consideration (i.e., the object of the object model) in determining whether to pair a given scene reference point with an additional given scene point for generating a feature vector based on the scene point pair and/or for performing other operations for the scene point pair (e.g., searching the object model, calculating a candidate in-plane rotation, voting for the candidate in-plane rotation and corresponding model reference point). For example, in some implementations of block 406 of FIG. 4, the system may select an additional scene point to pair with the scene reference point for performing one or more of the operations of blocks 408-414 based on the scene point pair, only when a distance between the scene reference point and the additional scene point satisfies a bounding measure of the object.

Figure 5:
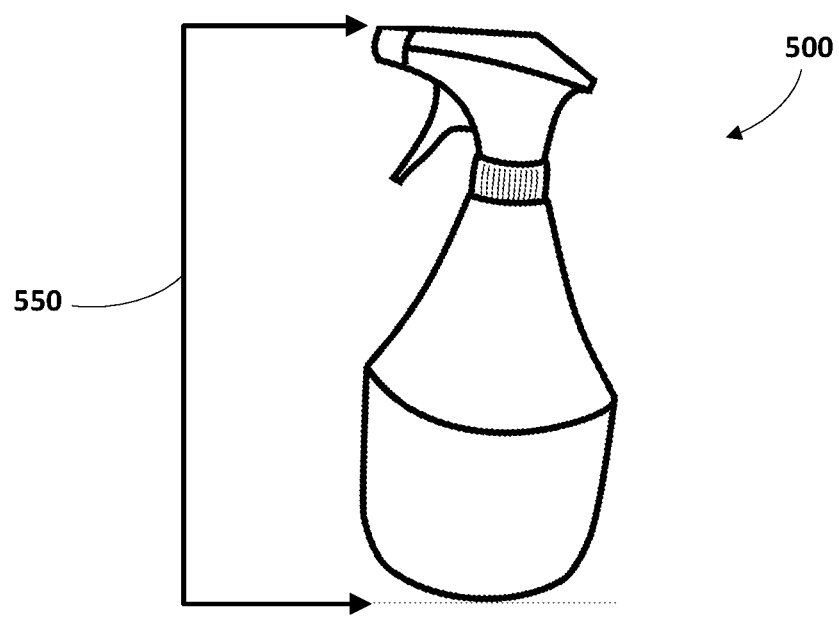
FIG. 5 illustrates a spray bottle and a line indicating the maximum diameter of the spray bottle.

In some implementations, the bounding measure may be based on a maximum diameter of an object under consideration. The maximum diameter of the object may be the maximum extent of the object in any dimension. For example, FIG. 5 illustrates a spray bottle 500 and illustrates a line 550 indicating the maximum diameter of the spray bottle 500. The line 550 indicates the maximum diameter of the spray bottle 500 since the maximum extents of the spray bottle are in the dimension of line 550 and are indicated by the arrows extending from line 550. A bounding measure based on the maximum diameter may be the true maximum diameter (i.e., the distance between the maximum extents of the object) and/or based on the true maximum diameter (e.g., 105% of the maximum diameter). In some implementations, the bounding measure may be identified from the object model. For example, the bounding measure may be stored in the object model and/or generated based on the object model. In some implementations, the bounding measure may be identified from other data associated with the object model or associated with the object of the object model.

Object detection and pose determination engine 140A or 140B may utilize various techniques to determine whether a distance between a given scene reference point and a given additional scene point satisfies a bounding measure of an object. For example, in some implementations the bounding measure may be a bounding distance, the engine 140A or 140B may calculate a distance between the given scene reference point and the given additional scene point, and determine whether the distance satisfies the bounding distance. For example, the distance may satisfy the bounding distance if it is less than (or optionally equal to) the bounding distance.

As another example, in some implementations object detection and pose determination engine 140A or 140B utilizes a voxel based approach to determine whether a distance between a given scene reference point and a given additional scene point satisfies a bounding measure of an object. For example, the engine 140A or 140B may generate a voxel grid in the 3D space of the scene point cloud data, where the bound of each voxel is based on the bounding measure of the object under consideration. For example, the bound of each voxel may be the true maximum diameter (i.e., the distance between the maximum extents of the object) and/or based on the true maximum diameter (e.g., 105% of the maximum diameter). The engine 140A or 140B may store, for each voxel, an indication of all of the scene points that "fit into" the voxel and/or, for each scene point, an indication of the voxel into which it fits. For example, the stored data may indicate: a first voxel and a first group of scene points that fit into that first voxel, a second voxel and a second group of scene points that fit into that second voxel, and so forth. Also, for example, the stored data may indicate: a first scene point and the voxel into which it fits, a second scene point and the voxel into which it fits, and so forth. As used herein, a scene point fits into a voxel if the position of the scene point is within the 3D area defined by the voxel.

When determining whether to pair a given scene point with a given scene reference point (or otherwise performing one or more operations for the scene point pair), the engine 140A or 140B may identify, from the stored data, the voxel to which the given scene reference point belongs. The engine 140A or 140B may then identify, from the stored data, all the scene point indications that fit into the voxel the given scene reference point belongs to and identify all the scene point indications that fall into voxels that are immediately adjacent to that voxel. The scene points associated with the identified scene point indications can then be utilized as potential pairing partners with the given scene reference point, while not utilizing scene points associated with non-extracted scene point indications as potential pairing partners (i.e., not utilizing those scene points that fit into voxels that are not: the voxel the given reference point fits in or any adjacent voxels).

In some implementations, the scene points associated with the extracted scene point indications may further be checked to ensure they satisfy the bounding measure. For example, the engine 140A or 140B may calculate a distance between the given scene reference point and the given additional scene point, and determine whether the distance satisfies the bounding measure. This further check may be desirable since, in some implementations of the voxel based approach, the distance between a given scene reference point and a given scene point identified as a potential pairing partner may not necessarily satisfy the bounding measure. For example, if the given scene reference point fits in one extent of a voxel and the given scene point fits in an opposite extent of an adjacent voxel, the distance between the two may not satisfy the bounding measure.

Figure 6:
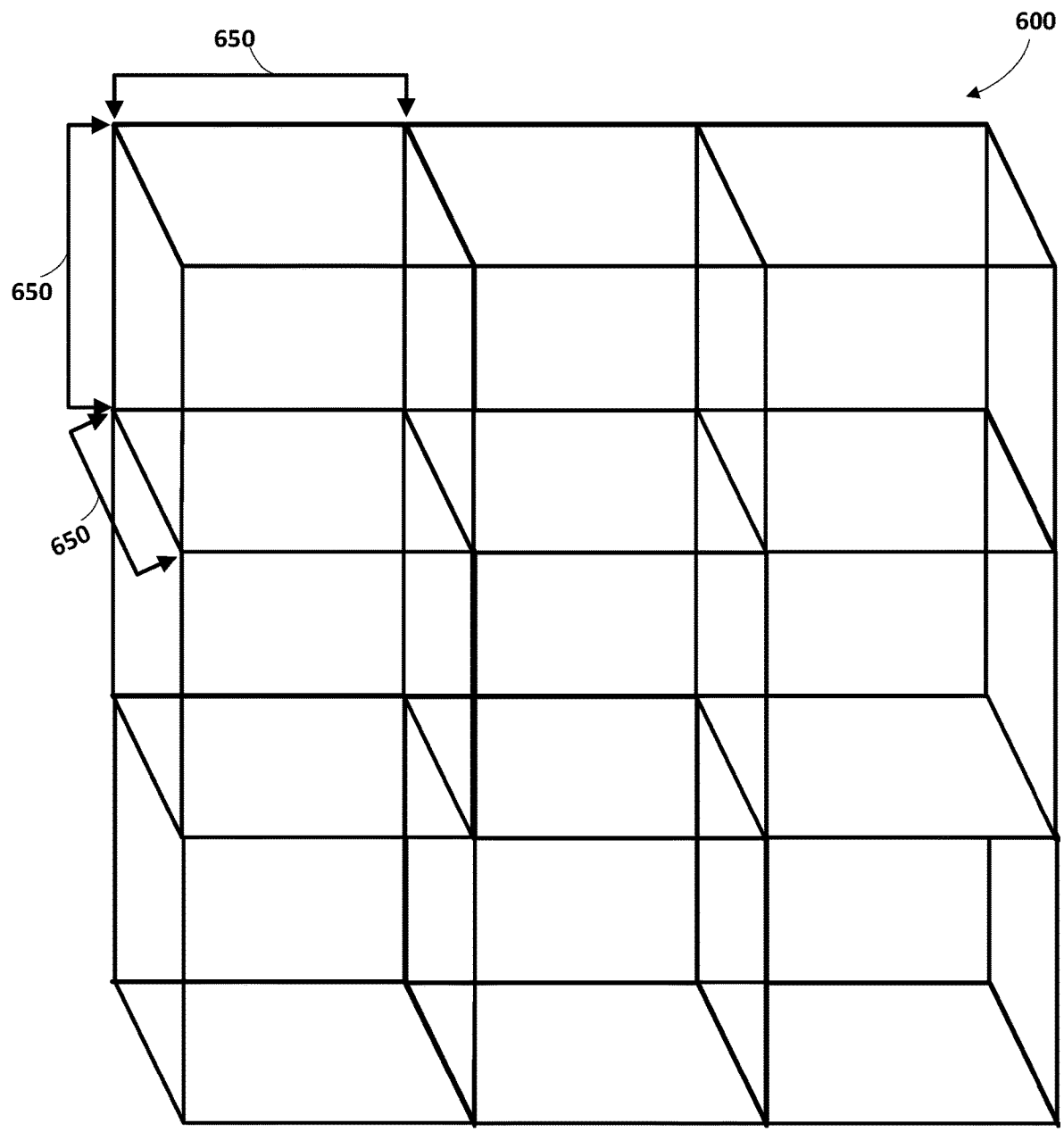
FIG. 6 is a graphical representation of voxels of a voxel grid that may be utilized in various implementations.

With reference to FIG. 6, a graphical representation of some voxels 600 of a voxel grid that may be utilized in a voxel based approach are illustrated. A graphical representation is illustrated in FIG. 6 for ease in description. However, it is noted that in some implementations, the engine 140A or 140B may not actually create a graphical representation of a voxel. For example, in some implementations the engine 140A or 140B may generate voxels with position coordinates and bounds for the voxels, without actually creating a graphical representation of the voxels.

Nine voxels are provided in FIG. 6 and represent voxels of a voxel grid that may be generated for scene point cloud data (the scene points of the scene point cloud data are not illustrated to simplify FIG. 6). Although only nine voxels are shown, it is understood that additional voxels may be provided, such as additional voxels provided in all six dimensions around the nine illustrated voxels. For example, additional voxels may be provided in-line with those illustrated and may be provided to the "left of", to the "right of", "below", "above", "behind", and "in front of" those illustrated. Each of the voxels of FIG. 6 has a bound 650 that is based on a maximum object diameter of the object under consideration. In particular, each voxel has the same bound 650 in each dimension.

Assume that a given reference point is included in the center voxel of FIG. 6. As described above, the engine 140A or 140B may utilize the stored mapping of scene points to voxels into which they fit to identify that the given reference point belongs to the center voxel. The engine 140A or 140B may then identify, from the mapping of voxels to scene point indications, all the scene point indications that fit into the center voxel that the given reference point belongs to. The engine 140A or 140B may further identify all voxels that are immediately adjacent neighbors to the center voxel, and identify all the scene point indications that fit into those voxels. It is noted that all of the illustrated voxels in FIG. 6 are immediate neighbors to the center voxel. It is further noted that eighteen additional unillustrated voxels are also immediate neighbors to the center voxel (i.e., the nine that would be immediately "behind" the nine illustrated and the nine that would be immediately "in front of" the nine illustrated).

The scene points associated with the identified scene point indications can then be utilized as potential pairing partners with the given scene reference point, while ignoring scene points associated with non-extracted scene point indications (i.e., ignoring those scene points that fit into other unillustrated voxels that are not immediately adjacent neighbors of the center voxel).

By extracting the scene point indications from the voxel the given reference point belongs to and from the adjacent voxels—and utilizing only scene points associated with those indications as potential pairing partners with the given reference point—the number of possible additional scene points for pairing with the given reference point can be reduced. Additionally, the voxel based techniques guarantee that each scene point that is in an object diameter sphere is paired with a given reference point for performing one or more operations for the pair. In some implementations, considering a bounding measure of the object under consideration and/or utilizing the voxel based techniques may enable additional scene points that satisfy the bounding measure (e.g., all scene points that satisfy the bounding measure) to be utilized as reference points, with reduced impact on runtime (since scene reference points will not each be paired with all other scene points—i.e., won't be paired with those that don't satisfy the bounding measure). This may increase efficiency during runtime by eliminating one or more calculations for scene point pairs that cannot be valid pairs for the object under consideration (every scene reference point needs to be paired with another scene point only if their distance relative to one another is within the bounds of the object).

Figure 7:
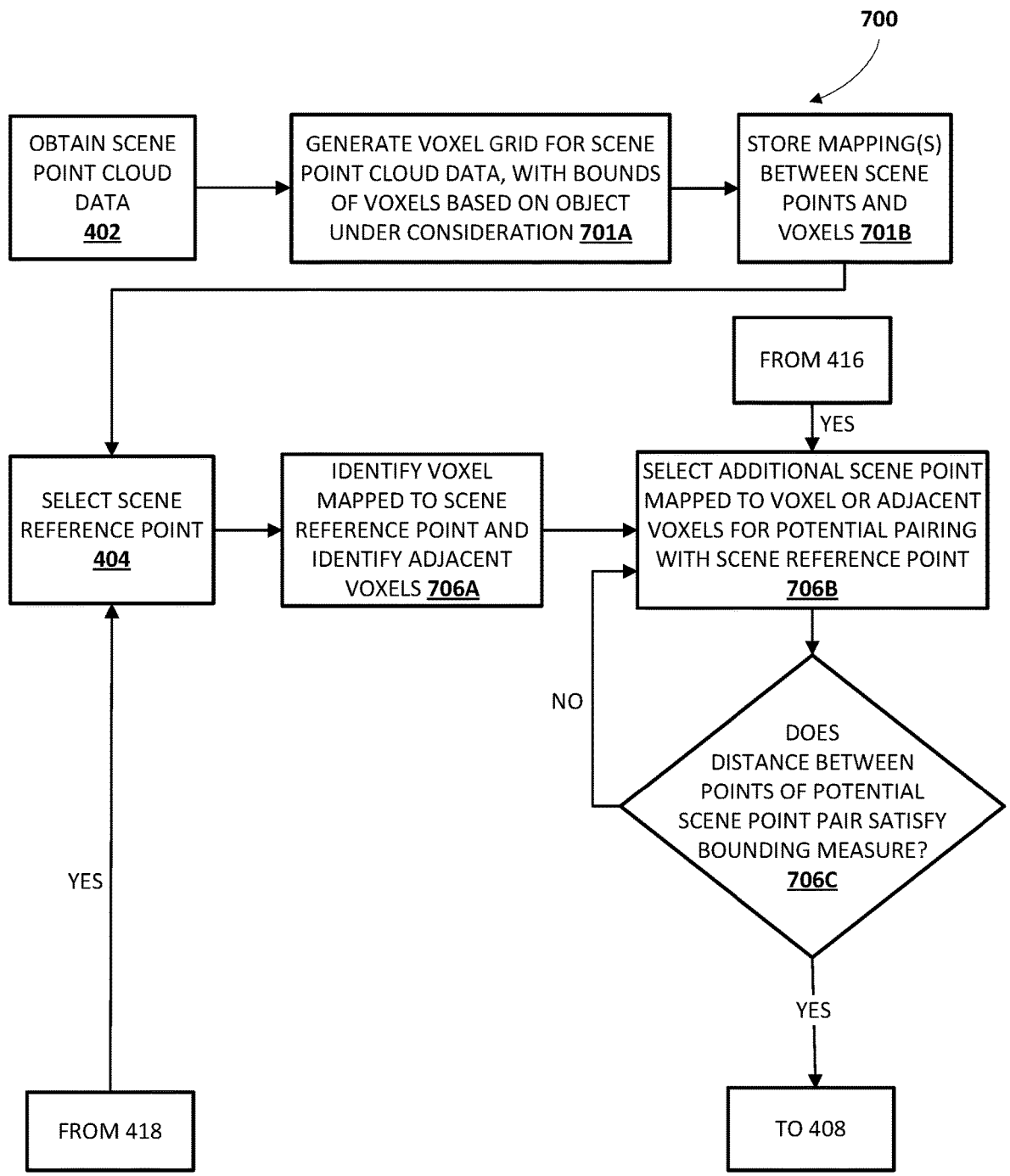
FIG. 7 illustrates aspects of another example method of determining the pose of an object based on scene point cloud data and an object model of the object.

With reference to FIG. 7, aspects of another example method 700 of determining the pose of an object based on scene point cloud data and an object model of the object are illustrated. For convenience, the operations of the method 700 are described with reference to a system that performs the operations. This system may include various components of various computer systems, such as object detection and pose determination engine 140A or 140B and/or processor 1102 (FIG. 11).

While particular operations of method 700 are shown and are shown in a particular order, this is not meant to be limiting. One or more operations may be reordered, omitted or added. For example, one or more operations may be reordered, omitted, or added as described herein with respect to various techniques related to detecting an object and/or determining the pose of the object based on scene point cloud data and an object model of the object.

The method 700 of FIG. 7 is illustrated as one particular implementation of the method 400 of FIG. 4 and the method 700 includes operations of the method 400. For example, block 402 is from the method 400. At block 402, the system obtains scene point cloud data from a 3D vision sensor as described with respect to method 400.

At block 701A, the system generates a voxel grid for the scene point cloud data, with the bounds of the voxels being based on the object under consideration. For example, the bound of each voxel may be the true maximum diameter (i.e., the distance between the maximum extents of the object) and/or based on the true maximum diameter (e.g., 105% of the maximum diameter).

At block 701B, the system stores mapping(s) between scene points of the scene point cloud data and the voxels of the generated voxel grid. For example, the system may store, for each voxel, an indication of all of the scene points that fit into the voxel and/or, for each scene point, an indication of the voxel into which it fits.

Block 404 is also from the method 400. At block 404, the system selects a scene reference point from the scene point cloud data.

In the method 700, blocks 706A-C represent a particular implementation of block 406 of FIG. 4. At block 706A, the system identifies a voxel that is mapped to by the selected reference point (i.e., via block 701B) and also identifies the voxels that are immediately adjacent to that voxel.

At block 706B, the system selects an additional scene point for potential pairing with the scene reference point. The system selects the additional scene point based on it being mapped to the voxel or the adjacent voxels identified at block 706A. In other words, the system selects the additional scene point based on it fitting into the voxel or the adjacent voxels identified at block 706A.

At block 706C, the system determines whether the distance between the scene reference point and the additional scene point selected at block 706B satisfies a bounding measure of the object under consideration. For example, in some implementations the bounding measure may be a bounding distance, the system may calculate a distance between the scene reference point and the additional scene point, and determine whether the distance satisfies the bounding distance. If the bounding measure is satisfied, the system proceeds to block 408 and other blocks of method 400 illustrated in FIG. 4. If the bounding measure is not satisfied, the system does not use the scene reference point and the additional scene point as a scene point pair for operations of block 408 and/or one or more of blocks 410, 412, and/or 414 of the method 400 of FIG. 4. Instead, the system returns to block 706B and selects an additional scene point based on the criteria of block 706B.

As described, in some implementations a bounding measure of an object under consideration may be based on a maximum diameter of the object, and may be considered in determining whether to pair a given scene reference point with a given additional scene point for generating a feature vector and/or for performing other operations for the pair (e.g., searching the object model, calculating a candidate pose).

In some implementations, the object detection and pose determination engine 140A or 140B may additionally and/or alternatively consider multiple bounding measures of an object under consideration. The multiple bounding measures may be considered, for example, to perform an "incremental" voting process, where votes cast for model reference points and candidate in-plane rotations generated based on scene point pairs that satisfy a smaller bounding measure of an object are considered separately from votes that include those cast for model reference points and candidate in-plane rotations generated based on scene point pairs that satisfy a larger bounding measure of the object.

Figure 8:
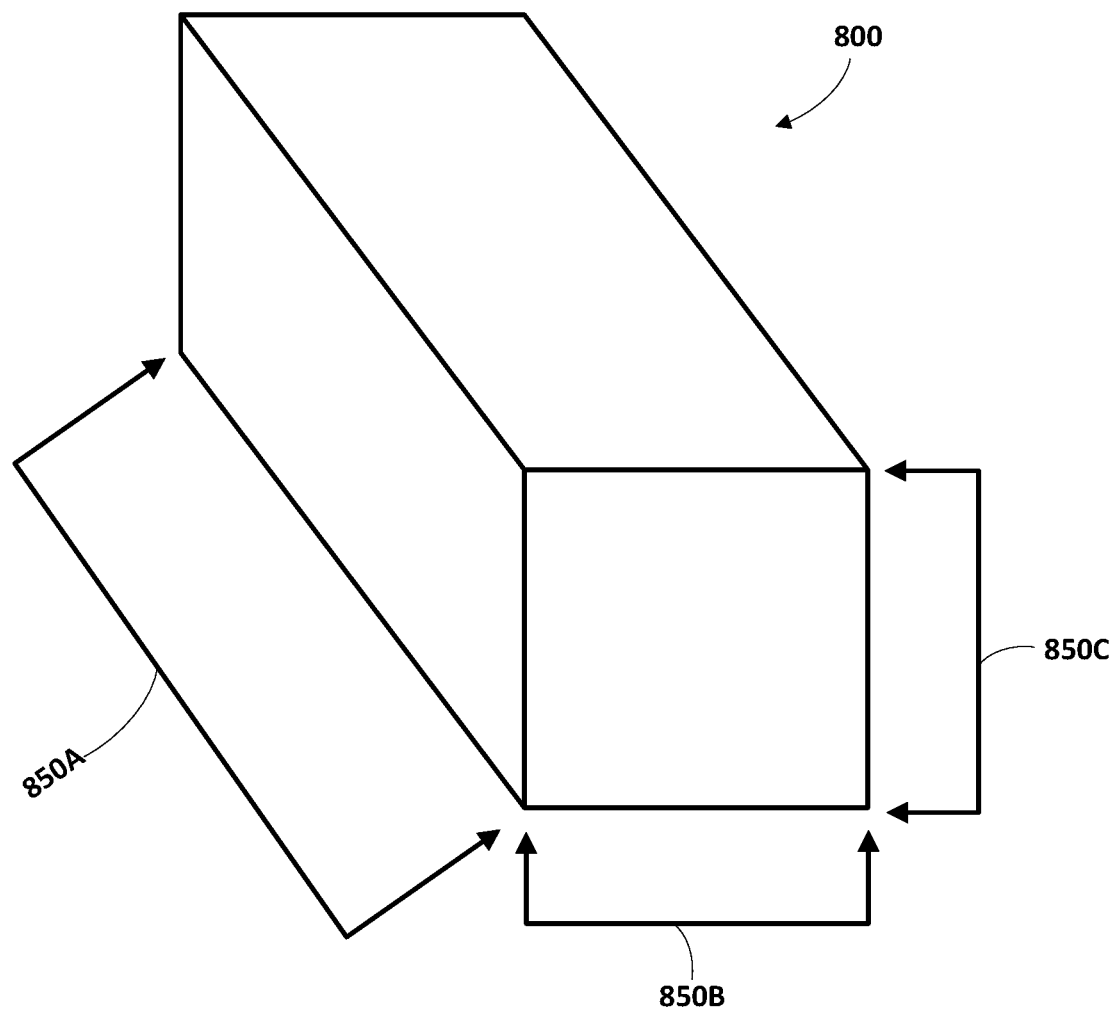
FIG. 8 illustrates a rectangular object and various diameters of the object.

This may be beneficial for objects that don't exhibit the same or similar bound in each dimension, in the situations where the one or more smaller bounds of the object are the dimensions that are solely or mainly visible in scene point cloud data. For example, consider the rectangular object 800 of FIG. 8 that has four long sides and two short ends. The maximum diameter 850A of the object 800 along a first dimension is approximately double the maximum diameters 850B and 850C of the object 800 along second and third dimensions. The maximum diameters 850B and 850C are the same for the rectangular object 800. If it is the case that only one of the short ends of the object 800 is visible in scene point cloud data, then considering during the voting process scene points that are outside of the maximum diameter of the short ends, without separately considering during the voting process those that are inside the maximum diameter of the short ends, may lead to errant results via the voting process (since many voting points will relate to nearby objects and not the object itself).

In some implementations, incremental voting is utilized for each of the scene reference points, where in one iteration of the voting a scene reference point is paired with additional scene points that are at most a "minimum bound", of the object under consideration, away from the scene reference point. The "minimum bound" may be based on the object model and/or other data associated with the object and may optionally be a "minimum bounding box", "minimum bounding sphere", or other shape that encloses a "smallest" dimension of the object—or may be the "minimum diameter" and/or based on the minimum diameter (e.g., 105% of the minimum diameter).

Feature vectors for these "minimum bound" scene point pairs are utilized to identify corresponding model point pairs, and to determine and vote for candidate in-plane rotations and model reference points as described herein. One or more voting peaks may be determined based on the votes cast for the "minimum bound" scene point pairs.

In an additional iteration of the voting, the scene reference point is paired with additional scene points that are included in a "larger bound" of the object under consideration, and that are not included in the "minimum bound". The "larger bound" may be a "maximum bounding box", "maximum bounding sphere" or other shape that encloses all of the object and/or an intermediary bounding box or other shape between a "minimum bounding shape" and "largest bounding shape"- or a maximum diameter or an intermediary diameter between the "minimum diameter" and the "maximum diameter". Feature vectors for these "larger bound" scene point pairs are utilized to identify corresponding model point pairs, and to determine and vote for candidate in-plane rotations and model reference points as described herein. For example, the votes for the candidate in-plane rotations and model reference points determined based on the "larger bound" scene point pairs may be added to the votes for the candidate in-plane rotations and model reference points determined based on the "minimum bound" scene point pairs. One or more voting peaks may be determined based on the votes cast for both the "minimum bound" scene point pairs and the "larger bound" scene point pairs.

Additional iterations may optionally be performed with "still larger" bounds. After the multiple voting iterations have been completed for each of a plurality of scene reference points, the voting peaks determined based on the cast votes for the different iterations are handled differently in determining a pose. For example, a candidate pose for the scene reference point may be first determined based on voting peaks determined based on votes cast during the "minimum bound" iterations and then optionally refined based on the voting peaks determined based on votes cast during both the "minimum bound" iterations and the "larger bound" iterations. Also, for example, the candidate poses determined based on voting peaks for the different iterations may be handled differently in a clustering technique utilized to estimate a pose, such as the clustering technique described in detail herein.

Figure 9:
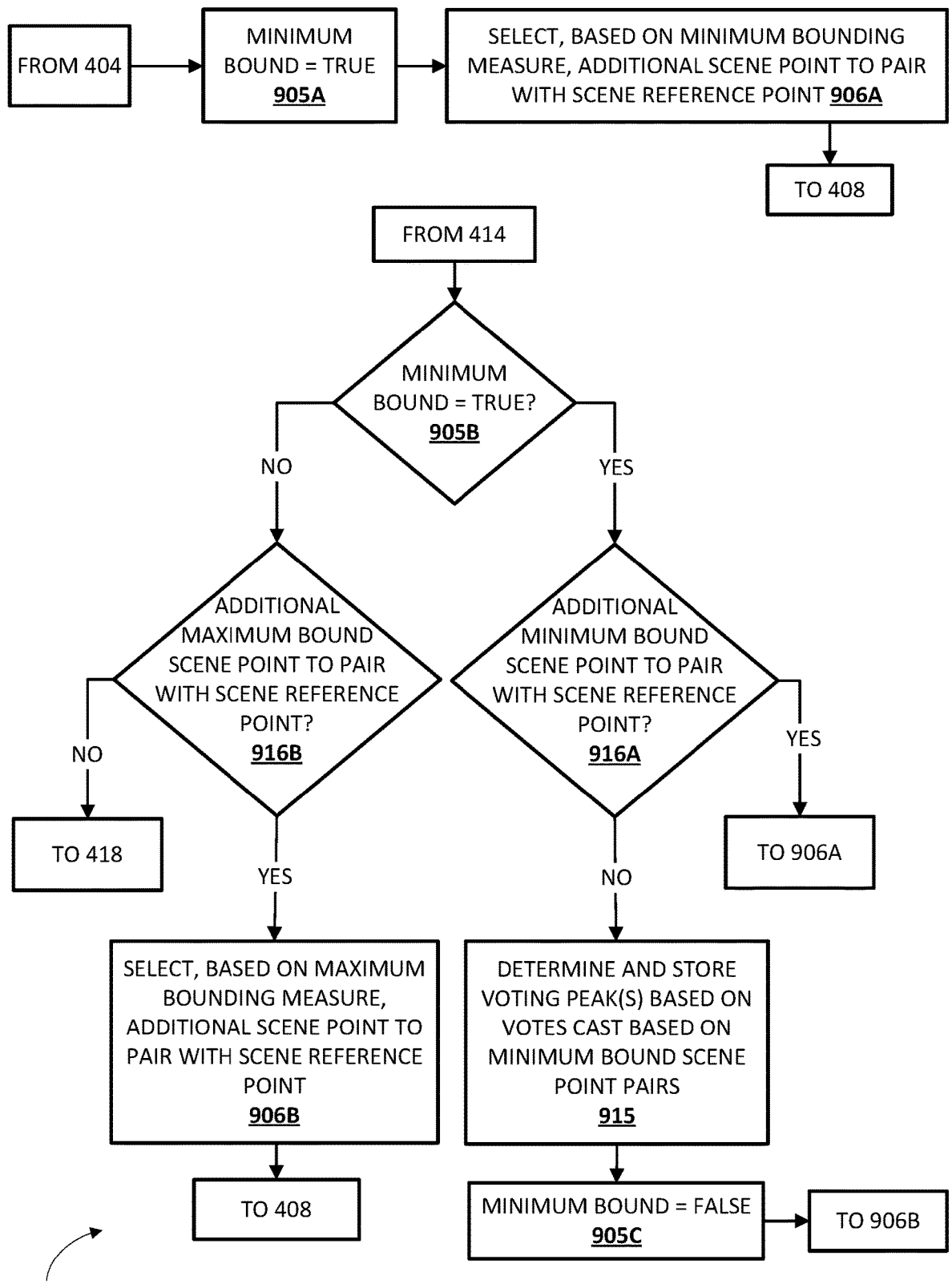
FIG. 9 illustrates an example method of voting based on multiple bounds of an object under consideration.

The object detection and pose determination engine 140A or 140B may utilize various techniques to consider multiple bounding measures of an object under consideration to perform an "incremental" voting process. One example is provided with reference to FIG. 9. FIG. 9 illustrates an example method 900 of voting based on multiple bounds of an object under consideration. For convenience, the operations of the method 900 are described with reference to a system that performs the operations. This system may include various components of various computer systems, such as object detection and pose determination engine 140A or 140B and/or processor 1102 (FIG. 11). While particular operations of method 900 are shown and are shown in a particular order, this is not meant to be limiting. One or more operations may be reordered, omitted or added.

The method 900 of FIG. 9 is illustrated as one particular implementation of the method 400 of FIG. 4 and the method 900 includes reference to operations of the method 400. Although the blocks of FIG. 9 are illustrated between certain blocks of the method 400 of FIG. 4, one or more blocks may be reordered. Also, it is understood that in some implementations the method 900 of FIG. 9 may be utilized in combination with other techniques described herein.

Block 905A follows block 404 of FIG. 4, where the system selects a scene reference point. At block 905A, the system sets a minimum bound value to "true", indicating votes are to be cast based on minimum bound scene point pairs for the scene reference point of block 404.

At block 906A, the system selects, based on a minimum bounding measure of the object under consideration, an additional scene point to pair with the scene reference point of block 404. Various techniques may be utilized to select the additional scene point. For example, in some implementations the system may utilize a voxel based approach, such as the approach described with respect to FIG. 7, with the bounds of the voxels and the bounding measure being based on the minimum bound of the object under consideration. Also, for example, the system may calculate distances between the scene reference point and candidate additional scene points, and select one of the candidate additional scene points whose distance from the scene reference point satisfies the minimum bounding measure.

From block 906A, the system proceeds to blocks 408, 410, 412, and 414 of FIG. 4. From block 414 of FIG. 4, the system proceeds to block 905B, where the system determines whether the minimum bound is true. In the initial iteration of FIG. 9 (and in additional iterations where the determination of block 916A is "yes"), the minimum bound will be true and the system will proceed to block 916A. At block 916A, the system determines whether there are additional "minimum bound" scene points to pair with the scene reference point of block 404. For example, in the voxel based approach the system may determine whether there are any remaining additional scene points mapped to the voxel that contains the scene reference point, or mapped to any adjacent voxels. If so, the system returns to block 906A and selects an additional scene point based on the minimum bounding measure to thereby form an additional "minimum bound" scene point pair that includes that additional scene point and the scene reference point. If not, the system proceeds to block 915.

At block 915, the system determines and stores voting peak(s) based on votes cast based on minimum bound scene point pairs. As described herein, the system may handle these voting peak(s) separately and/or differently in determining a pose of the object in the environment at block 420.

From block 915, the system proceeds to block 905C, where the system sets the minimum bound value to "false", indicating votes are no longer to be cast based on minimum bound scene point pairs for the scene reference point of block 404.

From block 905C, the system proceeds to block 906B. At block 906B, the system selects, based on a maximum bounding measure of the object under consideration, an additional scene point to pair with the scene reference point of block 404. For example, the system may select an additional scene point that satisfies the maximum bounding measure, but that does not satisfy the minimum bounding measure (i.e., an additional scene point that satisfies the maximum bounding measure but is not one of the additional scene points selected in previous iterations of block 906A). Various techniques may be utilized to select the additional scene point. For example, in some implementations the system may utilize a voxel based approach, such as the approach described with respect to FIG. 7, with the bounds of the voxels and the bounding measure being based on the maximum bound of the object under consideration (while taking into consideration which scene points were already selected in previous iterations of blocks 906A and 906B).

From block 906B, the system proceeds to blocks 408, 410, 412, and 414 of FIG. 4. In some implementations, at block 414 vote(s) are cast "on top of" the votes already cast in previous iterations of block 414 based on minimum bound scene point pairs. From block 414 of FIG. 4, the system proceeds again to block 905B, where the system determines whether the minimum bound is true. Since the minimum bound was set to false at block 905C, the minimum bound will not be true and the system will proceed to block 916B. At block 916B, the system determines whether there are additional "maximum bound" scene points to pair with the scene reference point of block 404. For example, in the voxel based approach the system may determine whether there are any remaining additional scene points mapped to the voxel that contains the scene reference point, or mapped to any adjacent voxels—and that were not previously selected in previous iterations of block 906A and block 906B. If so, the system returns to block 906B and selects an additional scene point based on the maximum bounding measure to thereby form an additional "maximum bound" scene point pair that includes that additional scene point and the scene reference point. If not, the system may determine and store one or more voting peak(s) based on votes cast based on the maximum bound scene point pairs (which may be votes cast on top of the votes cast based on the minimum bound scene point pairs). The system then proceeds to block 418 of FIG. 4.

As described herein, at block 418 of FIG. 4, the system determines whether there are additional scene reference points to select from the scene point cloud data. If so, the system returns to block 404 and selects another scene reference point to pair with a plurality of additional minimum bound scene points and maximum bound scene points as described in method 900. If not, the system proceeds to block 420 of FIG. 4.

In the method 900, at block 420 of FIG. 4 "minimum bound" voting peak(s) and "maximum bound" voting peak(s) will have been determined for each of a plurality of scene reference points. For example, a minimum bound voting peak and a maximum bound voting peak will have been determined for a first scene reference point, a minimum bound voting peak and a maximum bound voting peak will have been determined for, and so forth. The minimum bound voting peaks and the maximum bound voting peaks may be handled separately and/or differently at block 420 in determining a pose. For example, a pose may be first determined based on the minimum bound voting peaks for a plurality of the scene reference points and then optionally refined based on the maximum bound voting peaks for a plurality of the scene reference points. Also, for example, candidate poses determined based on minimum bound voting peaks and candidate poses determined based on maximum bound voting peaks may both be considered in a clustering technique utilized to determine a pose, such as the clustering technique described in detail herein.

It is noted that in the method 900, blocks 906A and 906B represent a particular implementation of block 406 of the method 400 of FIG. 4 and blocks 916A and 916B represent a particular implementation of block 416 of the method 400 of FIG. 4.

As another example of considering multiple bounding measures of an object under consideration to perform an "incremental" voting process, in some implementations multiple iterations of the method 700 of FIG. 7 may be performed, with one iteration using a minimum bound of the object under consideration and another iteration using a maximum bound of the object under consideration. For example, in one iteration the bounds of the voxels and the bounding measure may be based on the minimum bound of the object under consideration. In another iteration, the bounds of the voxels and the bounding measure may be based on the maximum bound of the object.

Consistency Checking

As described herein, in some implementations object detection and pose determination engine 140A or 140B selects a plurality of scene reference points of scene point cloud data and, for each of the scene reference points, generates feature vectors for a plurality of scene point pairs that each include the scene reference point and a corresponding additional scene point from the scene point cloud data. For each feature vector for a scene reference point, engine 140A or 140B searches an object model for the feature vector (or a value based on the feature vector), and the model point pair(s) (if any) that are indexed by the feature vector (or value) are identified—and used to calculate candidate in-plane rotations and vote for the candidate in-plane rotations and their corresponding model reference points.

In many implementations, the same feature vector will be generated more than once for various scene point pairs determined for a given scene reference point. For example, the feature vector for Scene Reference Point1 and Additional Scene Reference Point2 may be the same as the feature vector for Scene Reference Point1 and Additional Scene Reference Point3.

Moreover, it is possible that the same candidate in-plane rotation will be determined based on the same model point pair for various scene point pairs that have the same feature vectors and the same scene reference point. For example, the in-plane rotation determined based on Scene Reference Point1 and Additional Scene Reference Point2 based on Model Point Pair X may be the same as the in-plane rotation determined for Scene Reference Point1 and Additional Scene Reference Point3 based on Model Point Pair X. This may be due to various factors, such as discretization, utilization of the "populating adjacent bins" technique described herein, and/or the presence other objects/background influencing the scene point cloud data.

In some implementations, object detection and pose determination engine 140A or 140B may prevent, for a given scene reference point, multiple votes from being cast for a candidate in-plane rotation based on the same model point pair. For example, if the engine 140A or 140B has already cast a vote for the in-plane rotation determined based on Scene Reference Point1 and Additional Scene Reference Point2 based on Model Point Pair X, the engine 140A or 140B may not thereafter cast a vote for that same in-plane rotation determined for Scene Reference Point1 and Additional Scene Reference Point3 based on the same Model Point Pair X.

Object detection and pose determination engine 140A or 140B may utilize various techniques to prevent, for a given scene reference point, multiple votes from being cast for a candidate in-plane rotation based on the same model point pair. For example, in some implementations the engine 140A or 140B utilizes at least one consistency matrix (e.g., stored in memory) to prevent, for a given scene reference point, multiple votes from being cast for an in-plane rotation based on the same model point pair. For example, the matrix may be an n×n matrix, where n is the number of model points. Each entry of the matrix may be a multi-bit integer with a quantity of the bits determined based on discretization steps utilized in the voting for candidate in-plane rotations. For instance, at least a 32-bit integer may be utilized where 32 bins are used for discretizing candidate in-plane rotations.

When voting for a candidate in-plane rotation, the engine 140A or 140B may utilize the model point pair on which that candidate in-plane rotation is based to identify a corresponding position in the consistency matrix. For example, position (n, m) may be identified, where n is the index of the model reference point of the model point pair and m is the index of the other model point of the model point pair. The candidate in-plane rotation is utilized to identify a corresponding bit of the multi-bit integer present at position (n, m). For example, if the candidate in-plane rotation is in the 16th bin utilized for discretizing in-plane angles, the 16th bit may be identified.

If the bit is in a "not set position" (i.e., it has not been set before for the given scene reference point), then the engine 140A or 140B will cast a vote for the candidate in-plane rotation based on the model point pair—then the bit altered to a "set position" (thereby preventing further voting, for the given scene referent point, for the same in-plane rotation based on the same model point pair). If the bit is in a "set position" (i.e., it has been set before), then then the engine 140A or 140B will not cast a vote for the candidate in-plane rotation. Thus, it can be avoided that a vote for a candidate in-plane rotation will be cast more than once for a scene reference point based on the same model point pair. After votes are cast for the given scene reference point, the engine 140A or 140B can clear the consistency matrix to enable utilization of the consistency matrix for an additional scene reference point.

Figure 10:
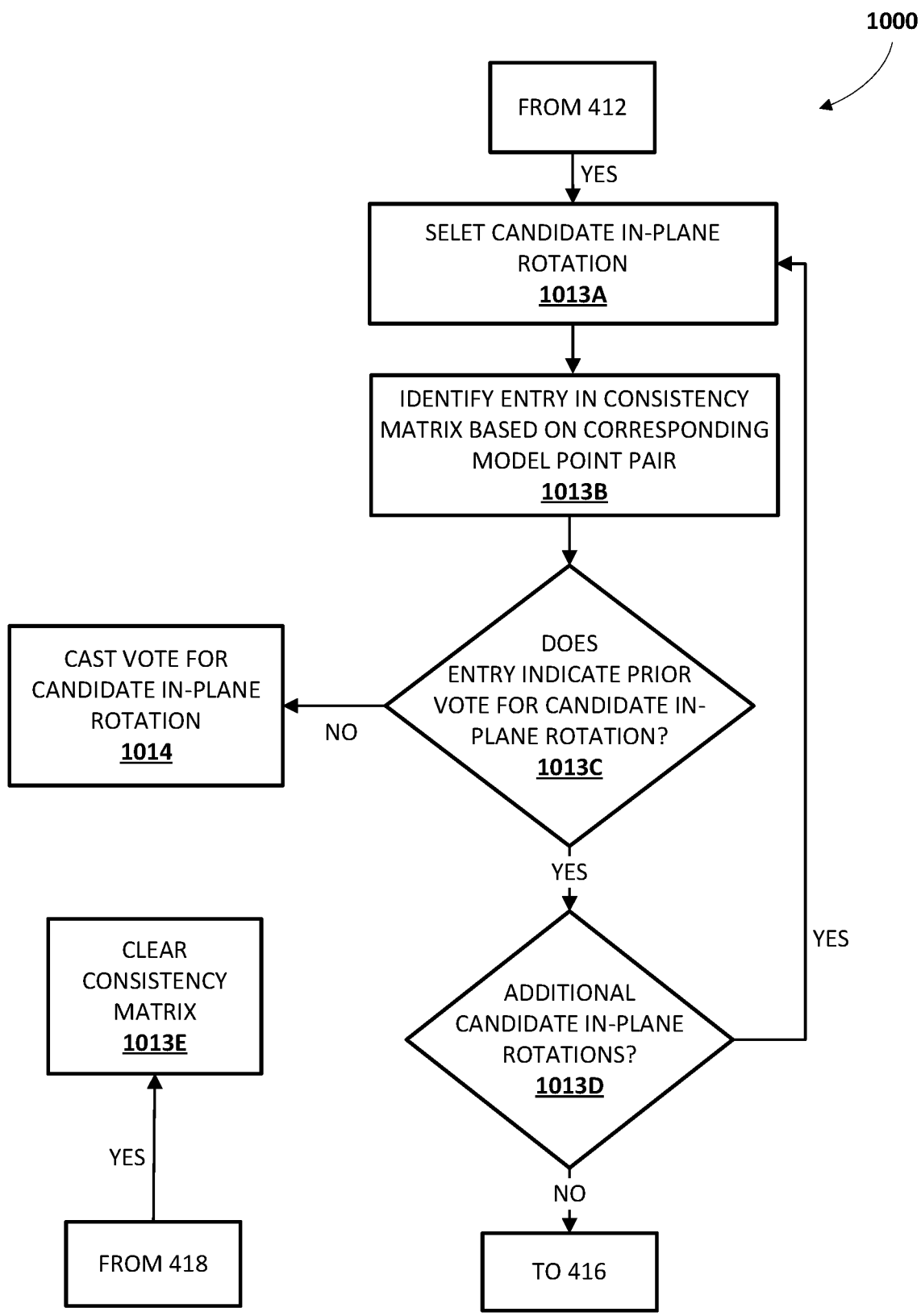
FIG. 10 illustrates an example method of preventing, for a given scene reference point, multiple votes from being cast for a candidate in-plane rotation based on the same model point pair.

FIG. 10 illustrates an example method 1000 of preventing, for a given scene reference point, multiple votes from being cast for a candidate in-plane rotation based on the same model point pair. For convenience, the operations of the method 1000 are described with reference to a system that performs the operations. This system may include various components of various computer systems, such as object detection and pose determination engine 140A or 140B and/or processor 1102 (FIG. 11). While particular operations of method 1000 are shown and are shown in a particular order, this is not meant to be limiting. One or more operations may be reordered, omitted or added.

The method 1000 of FIG. 10 is illustrated with reference to blocks 412 and 416 of the method 400 of FIG. 4 and is one implementation of block 414 of FIG. 4. Although the blocks of FIG. 10 are illustrated between blocks 412 and 416 of the method 400 of FIG. 4, one or more blocks may be reordered. Also, it is understood that in some implementations the method of FIG. 10 may be the implementation of block 414 that is utilized in combination with the example method 700 of FIG. 7 and/or may be incorporated in combination with the example method 900 of FIG. 9.

At block 1013A, the system selects one of the candidate in-plane rotations calculated in block 412.

At block 1013B, the system identifies an entry in a consistency matrix based on the model point pair utilized to calculate the candidate in-plane rotation selected at block 1013A. For example, position (n, m) may be identified, where n is the index of the model reference point of the model point pair and m is the index of the other model point of the model point pair.

At block 1013C, the system determines whether the entry indicates a prior vote for the candidate in-plane rotation. For example, the system may determine whether a certain bit of a multi-bit integer of the entry is "set" or "not set". The system may identify the certain bit based on the certain bit corresponding to the candidate in-plane rotation (i.e., a discretization of the candidate in-plane rotation).

If the entry indicates a prior vote has not been cast for the candidate in-plane rotation, the system casts a vote for the candidate in-plane rotation at block 1014. For example, the system may cast a vote for the candidate in-plane rotation and the corresponding model reference point on which the candidate in-plane rotation was calculated.

If the entry indicates a prior vote has been cast for the candidate in-plane rotation, the system doesn't cast a vote for the candidate in-plane rotation, and instead proceeds to block 1013D.

At block 1013D, the system determines if there are any additional candidate in-plane rotations from those calculated at block 412. If so, the system returns to block 1013A to select another candidate in-plane rotation. If not, the system proceeds to block 416.

FIG. 10 also includes block 1013E, which may proceed from an affirmative decision at block 418 of FIG. 4. At block 1013E, the system clears the consistency matrix to enable utilization of the consistency matrix for an additional scene reference point. In some implementations, one or more look-up-tables may be utilized in combination with a consistency matrix.

Voting for Adjacent In-Plane Rotations

As described herein, in various implementations of detecting an object and/or determining the pose of the object, the object detection and pose determination engine 140A or 140B casts votes for one or more candidate in-plane rotations calculated based on a corresponding scene point pair and model point pair—and those votes are utilized to determine a pose of the object.

For example, as described with respect to block 414 of the method 400 of FIG. 4, the system casts vote(s) based on the calculations of block 412. For example, assume a first candidate in-plane rotation was calculated at block 412 based on the scene point pair and a first model point pair. At block 414, a vote may be cast for the first candidate in-plane rotation for the model reference point of the first model point pair. As also described herein, in some implementations, in addition to voting for a calculated candidate in-plane rotation at block 414, the system may also vote for one or more "adjacent" candidate in-plane rotations. For example, where a vote is cast for a given candidate in-plane rotation for a given model reference point, additional votes may also be cast for the given model reference point and additional candidate in-plane rotations that are adjacent to the given candidate in-plane rotation. This may increase robustness to any noise in the scene point cloud data.

As one example, assume the engine 140A or 140B calculates a given candidate in-plane rotation for a given {scene reference point, additional reference point} pair for a given model reference point. Instead of casting a vote for only the given candidate in-plane rotation for the given model reference point, a vote may also be cast for a candidate in-plane rotation that is one discretization step above the given candidate in-plane rotation and for a candidate in-plane rotation that is one discretization step below the given candidate in-plane rotation.

Clustering

As described herein, in various implementations of detecting an object and/or determining the pose of the object, the object detection and pose determination engine 140A or 140B casts, for each of a plurality of scene reference points, votes for one or more calculated candidate in-plane rotations and model point pairs. The voting peak(s) for each of the scene reference points are utilized to determine at least one candidate pose for the scene reference point, and the candidate poses for the scene reference points are utilized to determine the pose of the object.

In some implementations, in determining the pose of an object, the object detection and pose determination engine 140A or 140B clusters scene reference points according to their candidate poses (rotations and translations). The engine 140A or 140B utilizes one or more of the most heavily weighted clusters (e.g., those with the most members) to determine the pose. In some implementations, during the clustering, the object detection and pose determination engine 140A or 140B uses each scene reference point as a cluster center of a cluster and adds nearby scene reference points to the cluster if their corresponding candidate pose is close enough (e.g., in rotation and translation). For example, a given scene reference point may be added to a cluster having an additional scene reference point as the cluster center if: (1) the rotation for the given scene reference point is close enough to the rotation of the additional scene reference point that serves as the seed for the cluster and (2) if the translation of the given scene reference point is close enough to the translation of the additional scene reference point.

As described herein, one or more candidate in-plane rotations and model reference points may be selected for each scene reference point based on one or more "voting peaks" for that scene reference point (i.e., the candidate in-plane rotation(s) and model reference point(s) that received the most "votes" when that scene reference point was utilized). For instance, the candidate in-plane rotation and model reference point for a scene point may be based on the candidate in-plane rotation and model reference point that received the most votes for that scene point and/or an average of the top X candidate in-plane rotations and/or model reference points for that scene point, where X is an integer greater than one. The candidate in-plane rotations(s) and the model reference point(s) are then used to determine the candidate pose for the scene reference point.

In some implementations, for each cluster, the engine 140A or 140B adds a given scene reference point to the cluster only when the candidate pose for the scene reference point transforms the model center within a bounding measure of the cluster center, such as within a bounding measure that is based on a maximum diameter sphere that encloses the object (e.g., a bounding measure that is equal to 0.1*the maximum diameter of the object). A voxel grid technique (e.g., akin to the one described above) may optionally be utilized to determine which scene reference points and their candidate poses are potentially in the bounding measure of a cluster center. For example, a voxel grid can be generated with bounds of the voxels being based on the bounding measure, a voxel of the cluster center can be identified, and scene reference points that transform the model center within that voxel and to adjacent voxels can be considered as potentially within the bounding measure of the cluster center. The engine 140A or 140B may increase the cluster weight of each cluster (e.g., by "1") for every scene reference point that contributes to it (e.g., for every scene point whose candidate pose is "close enough"). A scene reference point and its candidate pose can optionally vote for (influence the weight of) multiple clusters.

A consistency table may optionally be utilized to track which scene reference points and assigned model reference point(s) have already voted for a cluster. In some of those implementations, a given scene reference point and corresponding model reference point may only be allowed to vote for the cluster if the distance to another scene reference point, with the same assigned model reference point and which has already voted for the cluster, is within a threshold distance (e.g., a distance of approximately about 1.5 times delta, where delta is the distance sampling step).

In some implementations, in order to allow scene reference points that are more likely to be an actual point of the object under consideration to vote first, scene reference points may be initially ranked based on the number of votes for their corresponding candidate in-plane rotations and model reference points on which their corresponding candidate pose is based, and higher ranked (e.g., those with the most votes) scene reference points may vote for clusters before lower ranked scene reference points.

The engine 140A or 140B may unify the clusters and one or more of the most heavily weighted clusters (e.g., those with the most votes) are selected. The engine 140A or 140B may utilize the candidate poses of the selected clusters to determine the pose of the object. Determining the pose of the object may optionally include determining a pose and refining the pose utilizing one or more post-processing techniques such as refinement with projective point-plane iterative closest point (ICP) and verification.

Mapping Model Point Pairs to Adjacent Feature Vectors in an Object Model

As described herein, in generating an object model, the object model generation engine 120 generates feature vectors for model point pairs of model point cloud data and stores a mapping of the feature vectors (or values based on the feature vectors) to the model point pairs in the object model. For example, hash keys based on the feature vectors may be utilized to index the model point pairs in a hash table or other data structure.

In some implementations, in addition to storing a mapping of a given feature vector to a given model point pair in the object mode, the object model generation engine 120 may also store a mapping of one or more additional feature vectors to the given model point pair. For example, as described herein, the object model generation engine 120 may also directly or indirectly map the model point pair to one or more additional feature vectors that are "adjacent" to the feature vector of block 208. In other words, the object model generation engine 120 may directly or indirectly assign each of the feature vectors (or values based on the feature vectors) in the object model to model point pairs from "adjacent" feature vectors or values (in addition to assigning the feature vectors or values to their corresponding model point pairs).

In some implementations, a first feature vector is "adjacent" to a second feature vector if: (1) the first feature vector includes a first group of one or more features, where the value for each of those features is only one discretization step away from that feature's value for the second feature vector; and (2) and any feature that is not in the first group has the same value in both the first and second feature vectors. For example, assume Feature Vector 1 ("FV1") has features {Ax, Bx, Cx, Dx}, where "A, B, C, D" represent the features and the subscripts "x" represent the corresponding values for those features. Adjacent feature vectors to FV1 in a "first dimension" would be a second feature vector (FV2) with features {Ax+1, Bx, Cx, Dx} and a third feature vector (FV3) with features {Ax−1, Bx, Cx, Dx}, where "+1" represents one discretization step "above" "x" and "−1" represents one discretization step "below" "x". Likewise, adjacent feature vectors to FV1 in a "second dimension" would be a fourth feature vector (FV4) with features {Ax, Bx+1, Cx, Dx} and a fifth feature vector (FV5) with features {Ax, Bx−1, Cx, Dx}. Likewise, adjacent feature vectors to FV1 in a "first and second dimension" would be a sixth feature vector (FV6) with features {Ax+1, Bx+1, Cx, Dx}, a seventh feature vector (FV7) with features {Ax−1, Bx+1, Cx, Dx}, an eight feature vector (FV8) with features {Ax+1, Bx−1, Cx, Dx}, a ninth feature vector (FV9) with features {Ax−1, Bx−1, Cx, Dx}. In total, feature vector FV1 would have eighty adjacent feature vectors.

In some implementations, the object model generation engine 120 assigns each of the feature vectors (or values based on the feature vectors) in the object model to model point pairs from "adjacent" feature vectors by including those adjacent feature vectors (or pointers to those adjacent feature vectors) as values in the bin indexed by the feature vector (or value based on the feature vector). For example, continuing with the example above, the bin for FV1 may include pointers to its adjacent feature vectors FV2, FV2, FV3, . . . , FV81. Utilizing such an approach guarantees at least "discretization step" robustness in each dimension to sensor noise, since each bin will include pointers to all feature vectors that are "adjacent" in one dimension to the feature vector that indexes the bin.

Discretization steps for the values of the features of feature vectors may be chosen based on various considerations, such as preventing over generalization. For example, a discretization for the angle features of the feature vector may be eight degrees and/or a discretization for the distance feature may be 0.0025 of the maximum diameter of the object. In such an example, +/− eight degrees of normal angle noise would be addressed by mapping adjacent feature vectors to model point pairs and (+/−0.025*object diameter) of distance noise would be addressed by mapping adjacent feature vectors to model point pairs. Accordingly, in various implementations mapping adjacent feature vectors to model point pairs may promote matching robustness that may otherwise suffer due to 3D vision sensor noise and/or discretization.

In some implementations, one or more look-up-tables may be utilized in mapping one or more model point pairs to adjacent feature vectors in an object model. For example, instead of or in addition to including model point pairs from "adjacent" feature vectors in the bin indexed by the feature vector (or value based on the feature vector), or including those adjacent feature vectors (or pointers to those adjacent feature vectors) as values in the bin indexed by the feature vector (or value based on the feature vector)—the object model may further include a look up table where each entry includes an index of the bin to a hash table and/or look-up table that holds all the features vectors for the specific hash key and, in addition, all the indices of the bins to a hash table and/or look-up table with a hash key whose corresponding feature vector is adjacent to that of the specific hash key. For example, continuing with the example above, an entry in a look-up-table will include the index for the hash table and/or look-up table bin that holds feature vector FV1 and indices to the hash table and/or look-up table bins that hold its adjacent feature vectors FV2, FV2, FV3, . . . , FV81.

In some implementations that include the consistency checking described herein and that include one or more model point pairs mapped to adjacent feature vectors in an object model, runtime may be reduced. For example, in some implementations a consistency matrix used in consistency checking may have the same dimensions as the hash table and/or look-up table that includes the feature vectors (or values based on the feature vectors) mapped to corresponding model point pairs. Each position in the consistency matrix may include a multi-bit integer, where each bit corresponds to a discretized in-plane angle and/or a part of the in-plane angle that can be computed for a whole set of model point pairs.

During runtime, for each feature vector generated based on scene point pairs for a given scene reference point, that feature vector (or value based on that feature vector) may be utilized to search the look-up-table and identify the index for the bin in the hash table and/or look-up table that stores all model point pairs with that feature vector and all the indices for the bins to the hash-map and/or look-up table that stores model point pairs with adjacent feature vectors. Each of those indices may then be checked in the consistency matrix to determine, for each of the indices, if that index has already been utilized to vote based on the in-plane angle and/or a part of the in-plane angle that can be computed for all the model point pairs in that bin. For example, a "model point pair independent" part of the in-plane rotation can be precomputed based on the scene point pair. The model point pair independent part can be discretized and that discretization may be compared to the entries in the indices of the consistency matrix to determine, for each of the indices, if a vote has been cast for the scene reference point based on that discretization. For instance, each entry of the consistency matrix may be a multi-bit integer with a quantity of the bits determined based on discretization steps of the in-plane angle and/or a part of the in-plane angle that can be computed for all the model point pairs in that bin—and the entries corresponding to that scene reference point pair checked to determine if they are set or not set (e.g., the bit of an entry can be checked that corresponds to the part on the in-plane angle for that scene point pair). For those that are "set" (i.e., they have been utilized to vote before for the given scene reference point), the corresponding index may be skipped. For those that are "not set" (i.e., it has not been utilized to vote before for the given scene reference point), the model point pairs that are mapped to that index may be identified from the table that includes the feature vectors (or values based on the feature vectors) mapped to corresponding model point pairs. Those model point pairs may be utilized to determine and vote for candidate in-plane rotations. Moreover, the bits corresponding to the in-plane angle and/or the part of the in-plane angle for that scene point pair may be altered to a "set position" for those entries in the consistency matrix that were previously not set (thereby preventing further voting, for the given scene referent point, for the same in-plane rotation based on the same model point pair).

Generating Feature Vectors for a Model Point Pair Based on the Points of the Model Point Pair being Simultaneously Visible As described herein, in generating an object model, the object model generation engine 120 generates feature vectors for model point pairs of model point cloud data and stores a mapping of the feature vectors (or values based on the feature vectors) to the model point pairs in the object model.

In some implementations, the object model generation engine 120 generates a feature vector for a given model point pair and/or maps the feature vector (or value based on the feature vector) to the given model point pair based on determining that the points of the given point pair are simultaneously visible by a 3D sensor at a given time instant. In other words, in those implementations a feature vector may not be calculated and/or the feature vector (or value based on the feature vector) may not be mapped to the given point pair in the object model if the points of the given point pair are not simultaneously visible. For instance, a feature vector may not be calculated for a point pair of a first point on a first side of a square object and a second point on an opposite second side of the square object.

In some implementations, the object model generation engine 120 may flag each of a plurality of model point pairs as simultaneously visible and/or not simultaneously visible based on rendering the model point cloud under a plurality of different views and analyzing which model point pairs are visible and/or not visible under any of those views. In some implementations, feature vectors for point pairs may be calculated, or not, depending on the flags of the point pairs. Additionally or alternatively, in some implementations, the point pairs may be mapped to feature vectors (or values based on the feature vectors) in an object model, or not, depending on the flags of the point pairs.

Calculating Normals for Points of a Point Set

As described herein, normals for points of a point cloud may be utilized in various aspects of object detection and pose determination. For example, normals may be utilized in calculating feature vectors for an object model and/or calculating feature vectors for point pairs from a scene point cloud. In calculating the normals for points used in creating an object model and/or in calculating the normals for a scene point cloud (i.e., the "sensed" point cloud to be compared to an object model), some techniques first subsample the point cloud based on a minimum distance constraint for the points. This prevents all of the points of the point cloud from being considered in calculating the normal for points of the point cloud—which may lead to reduced robustness.

Instead of sampling the point cloud before calculating normals, one or more engines and/or systems herein may utilize a non-sampled point cloud (e.g., using the entire point cloud) to calculate normals. For example, a normal can be calculated for each point in a point set of a point cloud based on an initial normal estimation for the point and based on normal(s) of one or more points that lie in a delta neighborhood of the selected point. This process can be performed iteratively (e.g., four times) over the point set, with the normal for the points of the point set being refined at each iteration.

As one example, in calculating the normal for a given point of the point set during a given iteration, a plane can be fit through all the points that lie in a delta neighborhood around the given point and one or more of those points that lie in the delta neighborhood selected. For example, those points that have a currently assigned (based on values of the current iteration) normal that is smaller than a threshold (e.g., 30 degrees) to the normal assigned to the given point may be selected. The normal of those points may be utilized to calculate the normal for the given point for the given iteration. For example, the normal for the given point at the given iteration may be adjusted based on the normal for those points. In some implementations, the contribution of each of those points in calculating the normal for the given point may be weighted based on the distance between the point and the given point and/or based on the difference in the angles for the current normal of the point and the given point. For example, the contribution of each point in calculating the normal for a given point may be weighted by the dot product between the current normal of the given point and the current normal of the point—and $\exp(d^2/\text{delta}^2)$, where d is the distance between the given point and the current point.

Considering Difference of a Point's Normal in Subsampling

In generating the object model, selecting scene reference points, and/or in other aspects, the respective point set may be subsampled to increase efficiency and/or for other purposes. Some techniques subsample based on a distance constraint such that every selected point has a minimum distance to the points in the subsampled group of points. However, subsampling based solely on a distance constraint may remove at least some important information (e.g., it would remove a point if it is too close to another point in the subsampled set even if its normal is fundamentally different).

In some implementations, one or more engines and/or systems described herein may take the normals of points into consideration in subsampling. For example, points may be selected if their normal direction is fundamentally different (e.g., greater than a threshold, such as 30 degrees) to the normal in the subsampled group of points. For instance, points may be selected based on a distance constraint, but while also selecting a point if its normal direction is fundamentally different (even if the distance constraint is not satisfied).

Creating Hash Keys

As described herein, hash keys may be generated based on feature vectors and those hash keys may be utilized as index values for an object model and may subsequently be utilized to search the object model. In some implementations, one or more engines and/or systems herein may utilize lookup tables to create hash keys. This may be more efficient than some other implementations of generating hash keys, such as using an "acos" function, dividing by the discretization step, and multiplying with the dimension factor. In some implementations, a scaled normalized dot product between vectors of two points of a point pair (i.e., vectors that describe their positions and normals) may be determined, an including angle determined based on the normalized dot product, and the lookup table utilized to identify a discretized index in each of the dimensions of a feature vector. The returned indices for the dimensions can then be multiplied with their corresponding dimension step factor and added to generate the hash key.

Determining In-Plane Rotations

As described herein, in-plane rotations between a scene point pair and a model point pair may be determined and utilized in determining candidate poses. In some implementations, in-plane angles for in-plane rotations are determined based on subtracting the in-plane angle for a scene point pair from the in-plane angle for a model point pair, checking for over/underflow, and correcting for overflow/underflow. In some implementations, to increase efficiency of determining in-plane angles, one or more engines and/or systems herein may discretize the in-plane angles for one or more model point pairs and scene point pairs as a multi-bit integer (e.g., 32 bit), where a set bit stands for the corresponding angle. For example, a set first bit may correspond to 11.25°, a second set bit may correspond to 22.50°, etc. In some of those implementations, a bitwise rotational left shift with a discretized in-plane angle for a scene point pair, where the rotational left shift is based on the discretized in-plane angle for the model point pair, provides a discretized version of the resulting in-plane angle between the two pairs. Accordingly, over/underflow checking can be prevented and the resulting multi-bit integer can optionally be utilized right away to check the consistency matrix described above.

FIG. 11 schematically depicts an example architecture of a robot. Robot 1100 may take various forms, including but not limited to a form similar to robot 130A, robot 130B, a telepresence robot, a humanoid form, an animal form, a wheeled device, a submersible vehicle, an unmanned aerial vehicle ("UAV"), and so forth. Robot 1100 includes at one processor 1102. Processor 1102 may take various forms, such as a central processing unit ("CPU"), a graphics processing unit ("GPU"), one or more field-programmable gate arrays ("FPGA"), one or more application-specific integrated circuits ("ASIC"), and/or one or more so-called "real time controllers."

In various implementations, processor 1102 may be operably coupled with one or more actuators 1104a-n and/or one or more sensors 1108a-m, e.g., via one or more buses 1110. Sensors 1108a-m may take various forms, including but not limited to three-dimensional vision devices, two-dimensional vision devices, light sensors, pressure sensors, pressure wave sensors (e.g., microphones), motion sensors, proximity sensors, accelerometers, gyroscopes, thermometers, barometers, and so forth. While sensors 1108a-m are depicted as being integral with robot 1100, this is not meant to be limiting. In some implementations, one or more sensors 1108a-m may be located external to robot 1100, e.g., as standalone units.

Processor 1102 may provide control commands to the actuators 1104a-n and/or the sensors 1108a-m to accomplish one or more tasks such as grasping objects, lifting objects, moving objects, navigating near objects, climbing stairs (e.g., when the robot 1100 is a humanoid robot), etc. Actuators 1104a-n may include, for example, one or more end effectors and/or one or more servo motors or other actuators to effectuate movement of one or more components of the robot. For example, the robot 1100 may have multiple degrees of freedom and each of the actuators 1104a-n may control actuation of the robot 1100 within one or more of the degrees of freedom responsive to the control commands. As used herein, the term actuator encompasses a mechanical or electrical device that creates motion (e.g., a motor), in addition to any driver(s) that may be associated with the actuator and that translate received control commands into one or more signals for driving the actuator. Accordingly, providing a control command to an actuator may comprise providing the control command to a driver that translates the control command into appropriate signals for driving an electrical or mechanical device to create desired motion.

The processor 1102 may provide real time bursts of data to the actuators 1104 a-n, with each of the real time bursts comprising a set of one or more control commands that dictate, inter alia, the parameters of motion (if any) for each of one or more of the actuators 1104a-n. In some implementations, control commands may be generated by processor 1102 to adjust the position of one or more operational components of the robot 1100 based on a pose of an object determined based on an object model according to techniques described herein. In some implementations, control commands may be generated by processor 1102 to adjust the position of one or more operational components of the robot 1100 based on detecting an object based on an object model according to techniques described herein (e.g., based on detecting the object is present based on a sufficient match between scene point cloud data and an object model).

Processor 1102 may further execute instructions to implement one or more (e.g., all) aspects of object detection and pose determination engine 140A or 140B and/or may establish a network connection with engine 140A or 140B via network interface subsystem 1115 (when engine 140A or 140B is separate from robot 1100) and provide various data to and/or receive various data from engine 140A or 140B as described herein. Network interface subsystem 1115 provides an interface to outside networks and is coupled to one or more corresponding interface devices in one or more other computer systems such as engine 140A or 140B. In some implementations, robot 1100 may incorporate, in addition to other components, one or more aspects of a computer system, such as computer system 1210 described below.

FIG. 12 is a block diagram of an example computer system 1210. Computer system 1210 typically includes at least one processor 1214 which communicates with a number of peripheral devices via bus subsystem 1212. These peripheral devices may include a storage subsystem 1224, including, for example, a memory subsystem 1225 and a file storage subsystem 1226, user interface output devices 1220, user interface input devices 1222, and a network interface subsystem 1216. The input and output devices allow user interaction with computer system 1210. Network interface subsystem 1216 provides an interface to outside networks and is coupled to corresponding interface devices in other computer systems.

User interface input devices 1222 may include a keyboard, pointing devices such as a mouse, trackball, touchpad, or graphics tablet, a scanner, a touchscreen incorporated into the display, audio input devices such as voice recognition systems, microphones, and/or other types of input devices. In general, use of the term "input device" is intended to include all possible types of devices and ways to input information into computer system 1210 or onto a communication network.

User interface output devices 1220 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 1210 to the user or to another machine or computer system.

Storage subsystem 1224 stores programming and data constructs that provide the functionality of some or all of the modules described herein. For example, the storage subsystem 1224 may include the logic to perform selected aspects of method 200, method 400, method 700, method 900, and/or to implement one or more aspects of processor 1102, engine 120, engine 140A, and/or engine 140B. Memory 1225 used in the storage subsystem 1224 can include a number of memories including a main random access memory (RAM) 1230 for storage of instructions and data during program execution and a read only memory (ROM) 1232 in which fixed instructions are stored. A file storage subsystem 1226 can provide persistent storage for program and data files, and may include a hard disk drive, a CD-ROM drive, an optical drive, or removable media cartridges. Modules implementing the functionality of certain implementations may be stored by file storage subsystem 1226 in the storage subsystem 1224, or in other machines accessible by the processor(s) 1214.

Bus subsystem 1212 provides a mechanism for letting the various components and subsystems of computer system 1210 communicate with each other as intended. Although bus subsystem 1212 is shown schematically as a single bus, alternative implementations of the bus subsystem may use multiple busses.

Computer system 1210 can be of varying types including a workstation, server, computing cluster, blade server, server farm, smart phone, smart watch, smart glasses, set top box, tablet computer, laptop, or any other data processing system or computing device. Due to the ever-changing nature of computers and networks, the description of computer system 1210 depicted in FIG. 12 is intended only as a specific example for purposes of illustrating some implementations. Many other configurations of computer system 1210 are possible having more or fewer components than the computer system depicted in FIG. 12.

While several implementations have been described and illustrated herein, a variety of other means and/or structures for performing the function and/or obtaining the results and/or one or more of the advantages described herein may be utilized, and each of such variations and/or modifications is deemed to be within the scope of the implementations described herein. More generally, all parameters, dimensions, materials, and configurations described herein are meant to be exemplary and that the actual parameters, dimensions, materials, and/or configurations will depend upon the specific application or applications for which the teachings is/are used. Those skilled in the art will recognize, or be able to ascertain using no more than routine experimentation, many equivalents to the specific implementations described herein. It is, therefore, to be understood that the foregoing implementations are presented by way of example only and that, within the scope of the appended claims and equivalents thereto, implementations may be practiced otherwise than as specifically described and claimed. Implementations of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present disclosure.

What is claimed is:

1. A method implemented by one or more processors, the method comprising:

obtaining a three-dimensional point cloud of an object;

selecting, from the three-dimensional point cloud, a model point pair that includes a model reference point and an additional model point;

generating a feature vector for the model point pair based on the model point pair, wherein the feature vector defines a plurality of features of the model point pair and defines each of the plurality of features at a corresponding discretization level;

storing, in one or more non-transitory computer readable media, a mapping of the feature vector to the model point pair;

determining an additional feature vector that is the same as the feature vector, but that includes a given value, for a given feature of the features, that varies from the feature vector by a single level of the corresponding discretization level of the given feature;

storing, in the one or more non-transitory computer readable media, a mapping of the feature vector to the additional feature vector or to one or more additional point pairs mapped to by the additional feature vector; and controlling a robot using the mapping.

2. The method of claim 1, wherein the mapping of the feature vector to the model point pair is a mapping of a hash value to the model point pair.

3. The method of claim 2, wherein the hash value is generated based on the feature vector.

4. The method of claim 1, wherein the mapping of the feature vector to the additional feature vector is a mapping of a first hash key to a second hash key, wherein the first hash key is generated based on the feature vector, and wherein the second hash key is generated based on the additional feature vector.

5. The method of claim 1, wherein controlling the robot using the mapping comprises:

receiving scene point cloud data that captures at least a portion of the object in an environment;

determining a pose of the object in the environment based on the scene point cloud data and the mapping of the feature vector to the additional feature vector or to one or more additional point pairs mapped to by the additional feature vector; and adjusting the robot based on the determined pose of the object in the environment.

6. The method of claim 5, wherein determining the pose of the object based on the scene point cloud data and the mapping of the feature vector to the additional feature vector or to one or more additional point pairs mapped to by the additional feature vector comprises:

determining a scene point pair from the scene point cloud data;

determining a feature vector of the scene point pair maps to the feature vector;

selecting the one or more additional point pairs based on the mapping of the feature vector to the additional feature vector or to one or more additional point pairs mapped to by the additional feature vector;

generating one or more candidate in-plane rotations based on the scene point pair and the one or more additional point pairs; and determining the pose of the object based on the one or more candidate in-plane rotations and reference points of the corresponding point pairs.

7. A system, comprising:

memory storing instructions;

one or more processors executing the instructions to:
  obtain a three-dimensional point cloud of an object;
  select, from the three-dimensional point cloud, a model point pair that includes a model reference point and an additional model point;
  generate a feature vector for the model point pair based on the model point pair, wherein the feature vector defines a plurality of features of the model point pair and defines each of the plurality of features at a corresponding discretization level;
  store, in one or more non-transitory computer readable media, a mapping of the feature vector to the model point pair;
  determine an additional feature vector that is the same as the feature vector, but that includes a given value, for a given feature of the features, that varies from the feature vector by a single level of the corresponding discretization level of the given feature; and
  store, in the one or more non-transitory computer readable media, a mapping of the feature vector to the additional feature vector or to one or more additional point pairs mapped to by the additional feature vector; and
  control a robot using the mapping.

8. The system of claim 7, wherein the mapping of the feature vector to the model point pair is a mapping of a hash value to the model point pair.

9. The system of claim 8, wherein the hash value is generated based on the feature vector.

10. The system of claim 7, wherein the mapping of the feature vector to the additional feature vector is a mapping of a first hash key to a second hash key,
  wherein the first hash key is generated based on the feature vector, and
  wherein the second hash key is generated based on the additional feature vector.

11. The system of claim 7, wherein one or more of the processors, in executing the instructions to use the mapping in controlling a robot, are to:
  receive scene point cloud data that captures at least a portion of the object in an environment;
  determine a pose of the object in the environment based on the scene point cloud data and the mapping of the feature vector to the additional feature vector or to one or more additional point pairs mapped to by the additional feature vector; and
  adjust the robot based on the determined pose of the object in the environment.

12. The system of claim 11, wherein in determining the pose of the object based on the scene point cloud data and the mapping of the feature vector to the additional feature vector or to one or more additional point pairs mapped to by the additional feature vector, one or more of the processors are to:
  determine a scene point pair from the scene point cloud data;
  determine a feature vector of the scene point pair maps to the feature vector;
  select the one or more additional point pairs based on the mapping of the feature vector to the additional feature vector or to one or more additional point pairs mapped to by the additional feature vector;
  generate one or more candidate in-plane rotations based on the scene point pair and the one or more additional point pairs; and
  determine the pose of the object based on the one or more candidate in-plane rotations and reference points of the corresponding point pairs.

13. One or more non-transitory computer-readable media comprising instructions that, in response to execution of the instructions by one or more processors, cause the one or more processors to perform the following operations:
  obtaining a three-dimensional point cloud of an object;
  selecting, from the three-dimensional point cloud, a model point pair that includes a model reference point and an additional model point;
  generating a feature vector for the model point pair based on the model point pair, wherein the feature vector defines a plurality of features of the model point pair and defines each of the plurality of features at a corresponding discretization level;
  storing, in one or more non-transitory computer readable media, a mapping of the feature vector to the model point pair;
  determining an additional feature vector that is the same as the feature vector, but that includes a given value, for a given feature of the features, that varies from the feature vector by a single level of the corresponding discretization level of the given feature;
  storing, in the one or more non-transitory computer readable media, a mapping of the feature vector to the additional feature vector or to one or more additional point pairs mapped to by the additional feature vector; and
  controlling a robot using the mapping.

14. The non-transitory computer-readable media of claim 13, wherein the mapping of the feature vector to the model point pair is a mapping of a hash value to the model point pair.

15. The non-transitory computer-readable media of claim 14, wherein the hash value is generated based on the feature vector.

16. The non-transitory computer-readable media of claim 13, wherein the mapping of the feature vector to the additional feature vector is a mapping of a first hash key to a second hash key,
  wherein the first hash key is generated based on the feature vector, and
  wherein the second hash key is generated based on the additional feature vector.

17. The non-transitory computer-readable media of claim 13, wherein execution of the instructions in controlling the robot using the mapping cause the one or more processors to perform the following operations:
  receiving scene point cloud data that captures at least a portion of the object in an environment;
  determining a pose of the object in the environment based on the scene point cloud data and the mapping of the feature vector to the additional feature vector or to one or more additional point pairs mapped to by the additional feature vector; and
  adjusting the robot based on the determined pose of the object in the environment.

18. The non-transitory computer-readable media of claim 17, wherein determining the pose of the object based on the scene point cloud data and the mapping of the feature vector to the additional feature vector or to one or more additional point pairs mapped to by the additional feature vector comprises:
- determining a scene point pair from the scene point cloud data;
- determining a feature vector of the scene point pair maps to the feature vector;
- selecting the one or more additional point pairs based on the mapping of the feature vector to the additional feature vector or to one or more additional point pairs mapped to by the additional feature vector;
- generating one or more candidate in-plane rotations based on the scene point pair and the one or more additional point pairs; and
- determining the pose of the object based on the one or more candidate in-plane rotations and reference points of the corresponding point pairs.

* * * * *